United States Patent
Takahashi et al.

(10) Patent No.: US 7,095,114 B2
(45) Date of Patent: Aug. 22, 2006

(54) SEMICONDUCTOR DEVICE WITH VIA HOLE GROUP GENERATING HIGH FREQUENCY ELECTROMAGNETIC BONDING, MANUFACTURING METHOD THEREOF, AND MONOLITHIC MICROWAVE INTEGRATED CIRCUIT

(75) Inventors: Naoki Takahashi, Kyoto-fu (JP); Nobuyuki Matsumoto, Nara (JP); Kazuhiko Shirakawa, Nara-ken (JP); Yoshinori Motouchi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/157,077

(22) Filed: May 30, 2002

(65) Prior Publication Data

US 2002/0180055 A1 Dec. 5, 2002

(30) Foreign Application Priority Data

May 30, 2001 (JP) ............................ 2001-162637

(51) Int. Cl.
*H01L 23/34* (2006.01)

(52) U.S. Cl. .................. 257/728; 257/774; 257/275; 257/276; 257/587

(58) Field of Classification Search ............. 257/197, 257/198, 275, 276, 587, 728, 774
See application file for complete search history.

(56) References Cited

U.S. PATENT DOCUMENTS

| | | | | |
|---|---|---|---|---|
| 5,202,752 A | * | 4/1993 | Honjo | 257/678 |
| 5,343,071 A | * | 8/1994 | Kazior et al. | 257/621 |
| 5,404,581 A | * | 4/1995 | Honjo | 455/90 |
| 5,488,253 A | | 1/1996 | Matsuoka | |
| 5,488,256 A | | 1/1996 | Tsunoda | |
| 5,528,209 A | * | 6/1996 | Macdonald et al. | 333/247 |
| 5,614,743 A | * | 3/1997 | Mochizuki | 257/276 |
| 5,818,077 A | | 10/1998 | Takahashi et al. | |
| 5,864,169 A | * | 1/1999 | Shimura et al. | 257/587 |
| 6,252,266 B1 | | 6/2001 | Hoshi et al. | |
| 2001/0033210 A1 | * | 10/2001 | Tanabe | 333/238 |
| 2002/0015291 A1 | * | 2/2002 | Kohjiro et al. | 361/760 |
| 2002/0153534 A1 | * | 10/2002 | Mochizuki et al. | 257/183 |

FOREIGN PATENT DOCUMENTS

| | | | |
|---|---|---|---|
| JP | 3-286559 A | | 12/1991 |
| JP | 07240645 | * | 1/1994 |
| JP | 6-244437 A | | 9/1994 |
| JP | 7-135210 | | 5/1995 |
| JP | 8-274116 A | | 10/1996 |
| JP | 8-279562 | | 10/1996 |
| JP | 2000-138236 A | | 5/2000 |
| JP | 2001-60831 A | | 3/2001 |

OTHER PUBLICATIONS

Peter Van Zant, Microchip Fabrication, 2000, McGraw–Hill, p. 398.*

* cited by examiner

*Primary Examiner*—Mary Wilczewski
*Assistant Examiner*—Monica Lewis
(74) *Attorney, Agent, or Firm*—Birch, Stewart, Kolasch and Birch, LLP

(57) ABSTRACT

An amplifier GaAs MMIC for microwave band applications includes a ground electrode 8 having a via hole group 12 composed of three via holes 11 filled with plated metals 10a that are formed adjacently. The interaction thereby generates high frequency electromagnetic bonding, which reduces the ground inductance. According to the MMIC, the ground inductance of the via hole may be reduced while decrease of a strength and increase of a size being restrained.

10 Claims, 23 Drawing Sheets

SEMICONDUCTOR DEVICE WITH VIA HOLE GROUP GENERATING HIGH FREQUENCY ELECTROMAGNETIC BONDING, MANUFACTURING METHOD THEREOF, AND MONOLITHIC MICROWAVE INTEGRATED CIRCUIT

BACKGROUND OF THE INVENTION

The present invention relates to a semiconductor device, a manufacturing method thereof, and a monolithic microwave integrated circuit, and more specifically to a semiconductor device and a manufacturing method thereof suitable for MMIC (monolithic microwave integrated circuit) and the like for microwave and millimeterwave band applications.

In view of improving gain and stability of MMIC (monolithic microwave integrated circuit), a via hole technology is essential for compound semiconductor MMIC because via holes may decrease ground inductances.

For example, a technology for forming a via hole from the surface of a semiconductor has been disclosed in Japanese Patent Laid-Open Publication No. HEI 7-135210. Detailed description will be given of the case where this prior art technology is applied to a GaAs HBT (hetero-junction bipolar transistor) MMIC for microwave band application shown in FIG. 28 as an example.

FIG. 28 is a plane view showing a structure of the prior art technology applied to an amplifier GaAs HBT-MMIC for microwave band application composed of a semiconductor device.

As shown in FIG. 28, the amplifier GaAs MMIC for microwave band application is composed of a first HBT element 101a, a second HBT element 101b, a third HBT element 101c, an MIM (metal-insulator-metal) capacitor 102, a spiral inductor 103, a resistive element 104, an input pad electrode 105, an output pad electrode 106, pad electrodes for HBT element control 107a and 107b, and a ground electrode 108.

A via hole manufacturing method by the prior art technology is applicable to the ground electrode 108 in the vicinity of the first HBT element 101a.

FIGS. 29 to 32 show conventional process for manufacturing semiconductor devices in sequence as disclosed in the above document.

In this manufacturing process, first as shown in a cross sectional view of FIG. 29, there are formed a ground electrode 108 and an emitter electrode 111, and then a first resist film 112 having an airbridge interconnection pattern is formed. Next, a first feeding layer 113 is formed on the entire surface.

Next as shown in a cross sectional view of FIG. 30, there is formed a second resist film 114 having a via hole pattern. Then as shown in a cross sectional view of FIG. 31, the first feeding layer 113 and a substrate 115 are etched down with the second resist film 114 used as a mask to form a via hole 116.

Next as shown in a cross sectional view of FIG. 32, a second feeding layer 117 is formed, and then electrolytic plating is executed with use of a third resist mask 118 having a specified pattern to integrate an airbridge interconnection 119 and an interconnection inside the via hole 116.

Next as shown in a cross sectional view of FIG. 33, with the substrate 115 being attached to a support substrate (unshown), the back surface of the substrate 115 is etched away till a plated metal inside the via hole 116 is exposed.

Further, a backside electrode 120 is formed on the entire surface to complete a compound semiconductor MMIC as shown in FIG. 28.

However, in the prior art technology, only a single via hole 116 is formed in each ground electrode 108 connected by the airbridge interconnection 119. Accordingly, reducing a ground inductance without changing an aperture area of the via hole 116 requires plating of a thicker metal film inside the via hole 116.

However, in the prior art technology, the airbridge interconnection 119 is plated and formed together with the metal film inside the via hole 116, which makes the thickness of a plated metal film forming the airbridge interconnection 119 larger. As a result, the third resist mask 118 is also required to be a thick negative resist.

However, usage of a thick negative resist for the third resist mask 118 causes such problems as deterioration of alignment precision and difficulty in obtaining apertures of fine line patterns.

Therefore, usage of a thick negative resist is not suited for the interconnection patterns that require alignment precision and fine lines like airbridge interconnections. This makes it impossible to increase the thickness of the plated metal inside the via hole 116, which gives the prior art technology a limit of reducing the ground inductance of the via hole.

Here, forming the airbridge interconnection 119 prior to forming the via hole 116 may be considered as a candidate solution.

However, reducing the ground inductance of one via hole 116 requires increase in thickness of a plated metal film, which causes large difference in thickness between a plated metal film forming the airbridge interconnection and a plated metal film in the vicinity of the via hole 116. As a result, unevenness on the front surface of the substrate 115 becomes larger, and therefore in etching the back surface of the substrate 115 while the front surface being attached to the support substrate, external force is concentrated at a part of the semiconductor substrate 115. As a consequence, there are caused problems that semiconductor substrates are broken or inclined, thereby affecting precision of the substrate thickness.

In addition, when an aperture area of the via hole is increased for reducing the ground inductance, an area of an MMIC chip is also increased, which prevents downsizing.

SUMMARY OF THE INVENTION

Accordingly, it is an object of the present invention to provide a semiconductor device, a manufacturing method thereof, and an MMIC capable of reducing the ground inductance of a via hole while restraining decrease of strength or increase of size.

In order to achieve the above object, there is provided a semiconductor device comprising a semiconductor element formed on one side of a semiconductor substrate and having a ground electrode and a via hole formed in the semiconductor substrate, the ground electrode of the semiconductor element being connected to an electrode provided on the other side of the semiconductor substrate through the via hole, wherein the via hole is provided in a plurality of numbers, and a plurality of the via holes are disposed adjacent to each other so that an electromagnetic field generated in each via hole is bonded to each other to constitute a via hole group.

According to the invention, a plurality of via holes are disposed adjacent to each other, so that a electromagnetic field generated in each via hole is bonded to each other. More specifically, plated metals formed on the inner walls of via holes are adjacent to each other with the semiconductor substrate interposed therebetween, so that when electric connection occurs, electromagnetic fields generated in each via hole are bonded. The bonding of electromagnetic fields caused by interaction between each via hole largely contributes to reduction of the inductance.

In one embodiment of the present invention, a distance between a plurality of the via holes at a most adjacent point is 5 µm or more and 50 µm or less.

In this embodiment, a distance between a plurality of the via holes at a most adjacent point is set to be 5 µm or more and 50 µm or less, which enables efficient reduction of the ground inductance of the via hole. More specifically, with the distance of less than 5 µm problems of process such as decrease of yields are generated, while with the distance over 50 µm, the ground inductance is rapidly increased.

Setting a most adjacent distance between a plurality of the via holes to be 20 µm or less enables more effective occurrence of field bonding, thereby implementing especially large effect of reducing the inductance. In the case where the distance is set to be 20 µm or more and 50 µm or less, the electromagnetic field is weakened compared to the case where the distance is set to be 20 µm or less, so that dramatic effect of reducing the inductance is not achieved, though there is implemented larger effect of reducing the inductance than that in the case of disposing via holes just in parallel.

In one embodiment of the present invention, a plurality of the via holes have an aperture shape of an approximate rectangle on the semiconductor substrate.

According to the embodiment, a plurality of the via holes have an aperture shape of an approximate rectangle on the semiconductor substrate, which enables adjacent via holes to increase the area of facing inner walls compared to approximate circular via holes. Consequently, when electric connection occurs, interaction between electromagnetic fields generated in each via hole leads to more efficient bonding of the electric fields. The bonding of the electric fields largely contributes to reduction of the inductance. Further, the via holes having the aperture shape of an approximate rectangle improves area efficiency in terms of array on the semiconductor substrate.

In one embodiment of the present invention, the via hole in the semiconductor substrate has an aperture short side with a size of 5 µm or more and 20 µm or less.

According to the embodiment, the via hole having the aperture shape of an approximate rectangle has an aperture short side with a size of 20 µm or less, so that the aperture of the via hole may be blocked by a plated metal with a thickness of 20 µm or less. Therefore, the plated metal (metal film) generated on the front surface of the semiconductor substrate is within 20 µm in thickness, which enables decrease of unevenness caused by difference in thickness of the metal films. This makes it possible to prevent deteriorated etching precision on the back surface of the semiconductor substrate due to unevenness caused by difference in thickness of the metal films on the front surface of the semiconductor substrate.

In the case where the width of an aperture short side of the approximate-rectangle via hole in the substrate is less than 5 µm, there is caused a new problem in manufacturing process that a dry etching speed in forming the via hole is rapidly dropped, thereby causing rapid decrease of an aperture depth of the via hole. Consequently, the width of an aperture short side of the approximate-rectangle via hole in the substrate is set to be 5 µm or more and 20 µm or less.

In one embodiment of the present invention, a plurality of the via holes are disposed so as to be aligned in a direction approximately orthogonal to an aperture long side of each via hole, and the aperture long side of each via hole is approximately parallel to each other.

According to the embodiment, a plurality of the via holes are disposed so as to be aligned in a direction approximately orthogonal to an aperture long side of each via hole, and the aperture long side of each via hole is approximately parallel to each other. Accordingly, compared to the case where the aperture short side of each via hole is disposed in parallel, the facing areas of adjacent inner walls of each adjacent via hole may be enlarged, which leads to more efficient bonding of electric fields generated in each via hole when electric connection occurs. The bonding of the electric fields largely contributes to reduction of the inductance of each via hole. Further, the above disposition enables alignment of each via hole on the semiconductor substrate with good area efficiency.

In one embodiment of the present invention, a plurality of the via holes constitute one via hole group per two or three via holes.

Like this embodiment, adjacent disposition of two or more via holes implements an effect of reducing the inductance inexplicable only by an adding effect obtained by simply increasing the number of via holes to be disposed in parallel. More particularly, there is implemented the effect of reducing the inductance due to bonding of electric fields. However, adjacent disposition of 5 or more via holes implements no remarkable effect of reducing the inductance inexplicable only by the adding effect obtained by simply increasing the number of via holes. It is noted that increase of the number of via holes enlarges the area occupied by the via holes on the substrate.

Consequently, setting the number of via holes included in one via hole group to two or three achieves both the inductance reduction effect and restraining the occupied area on the substrate.

In one embodiment of the present invention, a monolithic microwave integrated circuit of an amplifier for microwave band application comprises the semiconductor device of the present invention.

According to the embodiment, the monolithic microwave integrated circuit of an amplifier for microwave band application is composed of a semiconductor device of the above embodiment, which dramatically reduces a ground inductance and improves gain in microwave bands. Further, improvement of gain in a desired frequency band expands design margins of other characteristics, which brings about a tendency to easily satisfying all the desired characteristics. This enables considerable decrease of a percent defective in a high frequency characteristic, thereby improving yields.

In one embodiment of the present invention, a monolithic microwave integrated circuit for millimeterwave band application with use of a microstrip line comprises a semiconductor device of the present invention for use as a point electrode for a short-circuit stub.

According to the embodiment, the monolithic microwave integrated circuit for millimeterwave band application with use of a microstrip line makes it possible to obtain a desired ground inductance value and sufficiently reduce the ground inductance. Therefore, particularly in the case where the monolithic microwave integrated circuit functions as an upconverter in a harmonic mixer MMIC (monolithic microwave integrated circuit) for millimeterwave band application, higher output power is attainable, which brings about characteristic effect of sufficiently decreasing conversion loss and improving output.

In one embodiment of the present invention, a monolithic microwave integrated circuit for millimeterwave band application with use of a microstrip line comprises a semiconductor device of the present invention that constitutes a ground electrode for a three-terminal active element.

According to the monolithic microwave integrated circuit for millimeterwave band application with use of a microstrip line in the embodiment of the present invention which has a high-frequency sensitive characteristics, reduction of ground inductance improves gain in millimeter bands. The ground electrode is preferably disposed adjacent to the three-terminal active element, and more specifically, the ground electrode is preferably disposed adjacent thereto as much as the manufacturing process permits.

In one embodiment of the present invention, a monolithic microwave integrated circuit for millimeterwave band application with use of a microstrip line comprises a semiconductor device of the present invention that constitutes a ground electrode disposed between a plurality of three-terminal active elements.

According to the monolithic microwave integrated circuit for millimeterwave band application with use of a microstrip line in the present embodiment, forming a plurality of via holes between a plurality of three-terminal active elements (e.g. single HBT elements) implements an effect of restraining increase of the ground inductance to the minimum despite the widened space between centers of the three-terminal active elements. Widening the space between centers of the three-terminal active elements as heating elements (e.g. single HBT elements) decreases heat resistance, resulting in further improvement of reliability of the three-terminal active elements and MMIC as well.

In order to obtain a good high-frequency characteristic like the three-terminal active element for millimeter band application (HBT element), elements that require operation in high current density need low ground inductance and low heat resistance to be fulfilled.

Also, there is provided a method for manufacturing a semiconductor device composed of a semiconductor device formed on one side of a semiconductor substrate and having a ground electrode and a via hole formed in the semiconductor substrate, the ground electrode of the semiconductor device being connected to an electrode provided on the other side of the semiconductor substrate through the via hole, comprising a step of forming an etching resist mask for forming the via hole, the step including a step of forming a first resist mask having a specified aperture, and a step of forming a second resist mask having an aperture inside the first resist mask having the specified aperture.

According to the method for manufacturing a semiconductor device of the present invention, reducing the area of a semiconductor substrate in contact with a second resist as an etching mask enables reduction of stress between the semiconductor substrate and the second etching resist mask. The reduction of the stress brings about an effect of decreasing deformation of the second etching resist mask.

In one embodiment of the present invention, the first resist mask is formed with a PFI-25A resist made by Sumitomo Chemical Co., Ltd., and the second resist mask is formed with an AZP4903 resist made by Clariant (Japan) K.K.

The AZP4903 resist made by Clariant (Japan) K.K. employed as the second resist mask in this embodiment is high in adherence to the semiconductor substrate, so that it is less susceptible to the influence of side etching conducted by dry etching, thereby making it possible to obtain the via hole aperture with a width close to the size of a resist mask aperture.

The PFI-25A resist made by Sumitomo Chemical Co., Ltd. employed as the first resist mask enables stable resist formation without deformation of an aperture cross section caused by external factors such as heat. In addition, in the case where the AZP4903 resist made by Clariant (Japan) K.K. is applied over the PFI-25A resist made by Sumitomo Chemical Co., Ltd., a mixed layer is not generated in an interface between the both resists, thereby enabling stable application.

In one embodiment of the present invention, the first resist mask is formed with an OFPR800 150CP resist made by Tokyo Ohka Kogyo Co., Ltd., and the second resist mask is formed with an AZP4903 resist made by Clariant (Japan) K.K.

According to the embodiment, the OFPR800 150CP resist made by Tokyo Ohka Kogyo Co., Ltd. forming the first resist mask makes it easy to make the resist pattern to have a normal taper-shaped aperture cross section through excessive expose and excessive development. Therefore, over the first resist mask, the AZP4903 resist made by Clariant (Japan) K.K. may be applied in a stable state, in addition to which the stress between the second resist mask and the substrate may be effectively relaxed.

Also, there is provided a method for manufacturing a semiconductor device composed of a semiconductor device formed on one side of a compound semiconductor substrate and having a ground electrode and a via hole formed in the compound semiconductor substrate, the ground electrode of the semiconductor device being connected to an electrode provided on the other side of the compound semiconductor substrate through the via hole, comprising a step of forming a plated metal film on an inner wall of the via hole, the step including a first step of forming a first resist mask having a specified aperture including an aperture of the via hole, a step of forming a plated metal film on the first resist mask and an entire surface of one side of the semiconductor substrate, and a second step of forming a second resist mask having an aperture of approximately identical size to that of the aperture of the first resist mask with a material identical to a material of the first resist mask.

According to the method for manufacturing a semiconductor device in the above invention, on the first resist mask formed in the first step, there is formed the second resist mask having an aperture with the size approximately identical to that of the aperture of the first resist mask. Consequently, even if a relatively thin resist is used as the second resist mask, thick plating is achievable. In addition, usability of a thin resist brings about effects that alignment precision will not deteriorate, and an aperture of fine line is obtainable with good precision. Further, an identical kind of resist is used as the first and the second resist masks, which may restrain increase of a cost of labor in the manufacturing process to the minimum.

In one embodiment of the present invention, the first resist mask and the second resist mask are formed with a ZPN1100 resist made by ZEON Corporation.

According to the method for manufacturing the semiconductor device in the embodiment, the ZPN1100 resist made by ZEON Corporation employed as the first resist mask and the second resist mask enables variation of the form of an aperture by baking temperature as well as alteration of tolerance to organic solvents.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The embodiments of the present invention will be described hereinafter in detail with reference to accompanying drawings.

(First Embodiment)

Figure 1:
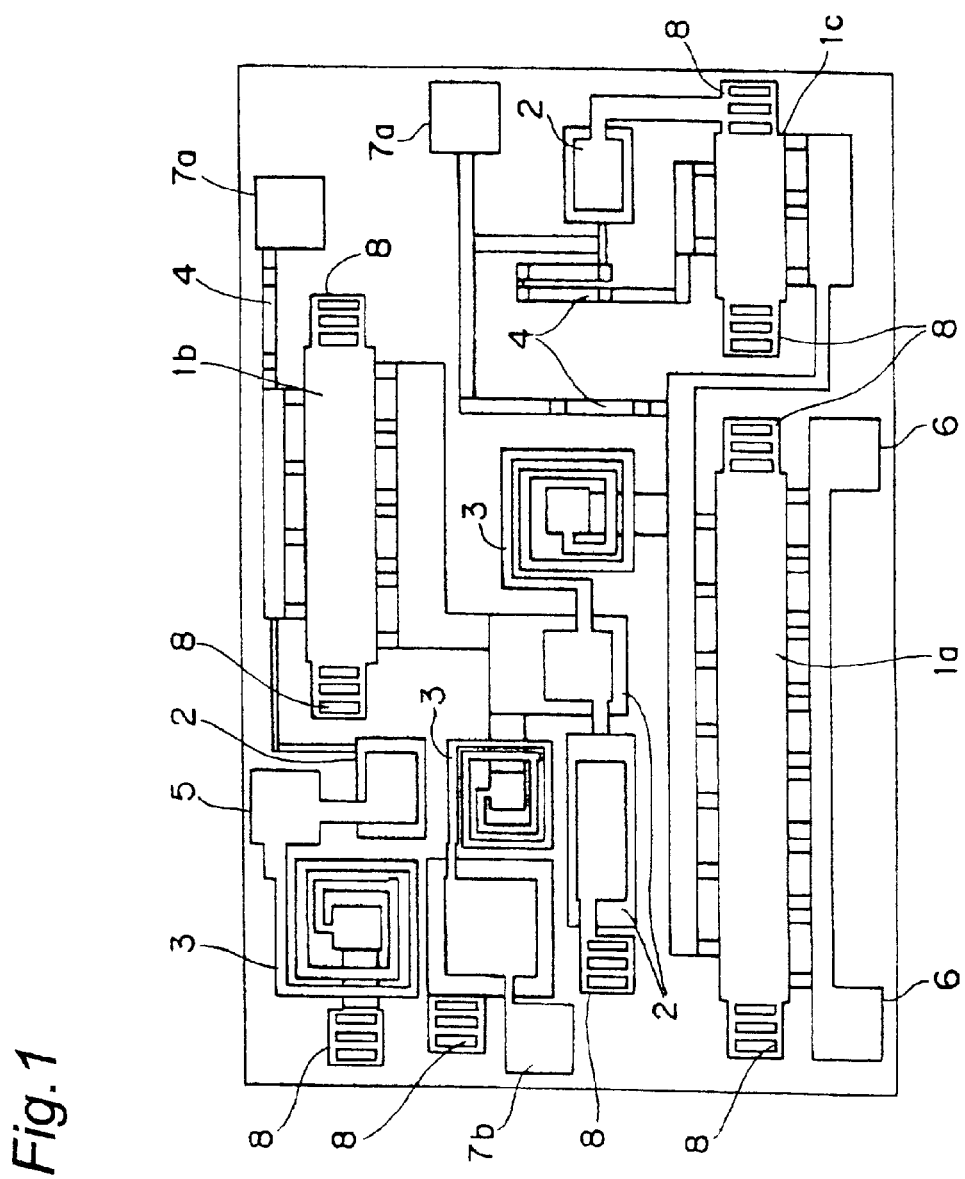
FIG. 1 is a plane view showing the structure of an amplifier MMIC for microwave band application in the first embodiment of the present invention.

FIG. 1 is a plane view showing the structure of an amplifier GaAs MMIC for microwave band application in the first embodiment of the present invention. The amplifier GaAs MMIC for microwave band application in the first embodiment is composed of a first HBT element 1a, a second HBT element 1b, a third HBT element 1c, an MIM capacitor 2, a spiral inductor 3, a resistive element 4, an input pad electrode 5, an output pad electrode 6, pad electrodes for HBT element control 7a and 7b, and a ground electrode 8.

Figure 2:
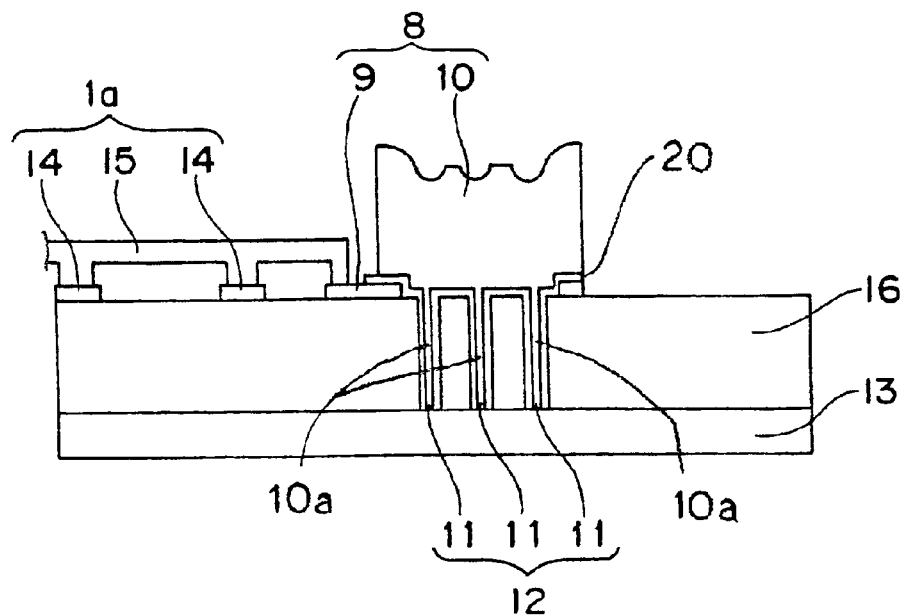
FIG. 2 is a cross sectional view showing a ground electrode in the first embodiment of the present invention.

FIG. 2 is a cross sectional view showing the vicinity of the ground electrode 8 of the first HBT element 1a. As shown in FIG. 2, the ground electrode 8 is composed of an under-layer ground electrode 9 and an upper-layer ground electrode 10, and provided with a via hole group 12 consisting of three via holes 11. A plated metal 10a extended from the upper-layer ground electrode 10 is filled in the three via holes and connected to a back surface electrode 13. Each ground electrode 8 shown in FIG. 1 has a structure identical to that of the ground electrode 8 shown in FIG. 2.

As shown in FIG. 2, an aerial interconnection 15, which connects between a plurality of emitter electrodes 14, 14 included in the first HBT element 1a, is formed so as to be connected to the under-layer ground electrode 9. From the under-layer ground electrode 9, the aerial interconnection 15 is connected to the back surface electrode 13 through the plated metal 10a inside the via hole group 12 consisting of three via holes 11.

The structure of the ground electrode of the first HBT element 1a shown in FIG. 2 is identical to the structure of the second HBT element 1b and the third HBT element 1c shown in FIG. 1. Among other passive elements shown in FIG. 1, the passive elements that need grounding (e.g., the MIM capacitor 2 and the spiral inductor 3) are connected by the aerial interconnection 15 to the back surface electrode 13 through the ground electrode 8 and the via hole group 12 like the HBT element 1a shown in FIG. 2.

Next, with reference to FIGS. 3 to 7 in sequence, description will be given of a manufacturing process of the ground electrode of the first HBT element 1a shown in FIG. 2 as an embodiment of the method for manufacturing a semiconductor device of the present invention.

Figure 3:
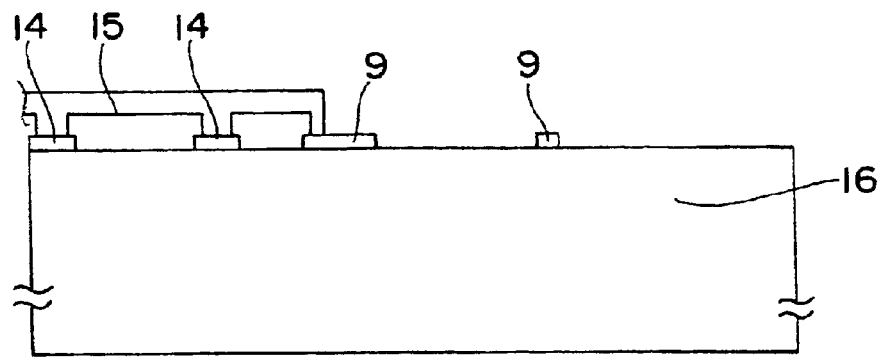
FIG. 3 is a cross sectional view showing one step of manufacturing the ground electrode in the first embodiment.

First, as FIG. 3 shows a cross section, on a GaAs substrate 16 with a thickness of 600 µm, there are formed a plurality of emitter electrodes 14, 14, and an aerial interconnection 15 for connecting between a plurality of the emitter electrodes 14, 14. It is noted that an under-layer ground electrode 9 is formed in advance on the substrate 16. In FIG. 3, electrodes other than the emitter electrodes are not illustrated for convenience of the drawing.

Figure 4:
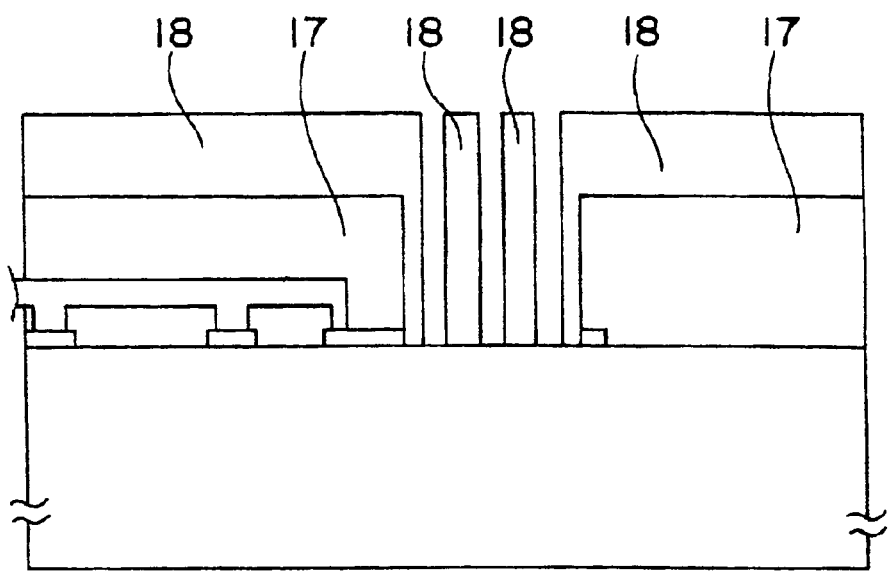
FIG. 4 is a cross sectional view showing one step of manufacturing the ground electrode in the first embodiment.

Next, as shown in FIG. 4, a positive resist is applied on the substrate 16 to form a resist pattern 17 having an aperture area slightly larger than the area for forming the via hole group 12 of FIG. 2. Next, a positive resist is applied on the resist pattern 17 to form a resist pattern 18 for forming via holes, and post baking is performed at about 90° C. for increasing tolerance to dry etching.

The via hole group 12 shown in FIG. 2 consists of three via holes 11, and each via hole 11 has an aperture in the shape of a rectangle. The rectangle aperture has a short side size of 13 µm and a long side size of 65 µm. As shown in the cross sectional view of FIG. 2 and the plane view of FIG. 1, three via holes 11 are disposed in parallel in a direction of the short sides thereof extending in orthogonal to the long sides thereof. The space between each via hole 11 is 13 µm.

Description is herein given of an advantage of forming the resist pattern 17 having an aperture area slightly larger than the area for forming the via hole group 12.

As the resist pattern 18 for forming the via hole group 12, a thick resist is used so as to enable etching operation for a long period of time. However, the thickened resist pattern 18, when having a large area, suffers deformation caused by stress generated inside the resist by a thermal influence during and after pattern formation. The deformation of the resist pattern 18 causes a problem of the aperture of the via hole increasing beyond a design value.

The deformation of the resist pattern 18 is considered to be attributed to the fact that a thicker and larger-area resist pattern 18 has the larger area in contact with the substrate 16 or with an insulating film as a substrate, which increases stress between the substrate 16 or the insulating film and the resist pattern 18.

In order to solve the problem, the stress between the substrate 16 and the resist pattern 18 needs to be decreased. For decreasing the stress, it is effective to decrease the area of the substrate 16 in contact with the resist pattern 18.

The result of our experiment indicates that forming another resist pattern 17 as a substrate layer of the resist pattern 18 may decrease the stress between the resist pattern 18 and the substrate 16 and may also diminish deformation of the resist pattern 18.

In the manufacturing method in this embodiment, a PFI-25A resist made by Sumitomo Chemical Co., Ltd. is used as the resist pattern 17, while an AZP4903 resist made by Clariant (Japan) K.K. is used as the resist pattern 18. The PFI-25A resist made by Sumitomo Chemical Co., Ltd. enables stable formation without deformation of an aperture cross section caused by external factors such as heat, which ensures stable application of the resist pattern 18 made up of the AZP4903 resist made by Clariant (Japan) K.K. on the resist pattern 17.

Further, the resist pattern 18 made up of the AZP4903 resist made by Clariant (Japan) K.K. is high in adherence to the semiconductor substrate 16, so that it is less susceptible to the influence of side etching conducted by dry etching. Accordingly, in the case where the resist pattern 18 has a narrow aperture, the via hole 11 may have an aperture whose width is close to an aperture size of the resist pattern 18 as a mask.

Figure 5:
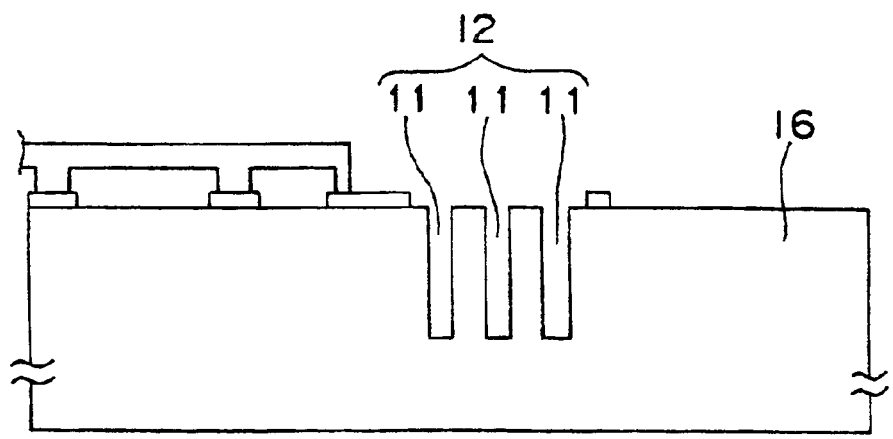
FIG. 5 is a cross sectional view showing one step of manufacturing the ground electrode in the first embodiment.

Next, with use of the resist pattern 18 in the area for forming the via hole group 12 as an etching mask, dry etching is conducted by an ICP (Inductively Coupled Plasma) etching unit to etch the GaAs substrate 16. By this, three via holes 11 are formed as shown in FIG. 5. These three via holes 11 constitute a via hole group 12.

Here, the ICP etching unit is provided with the ICP etching conditions of $Cl_2$(40 sccm)+$SiCl_4$(40 sccm) used as mixed gas, pressure of 30 Torr in an etching chamber, substrate temperature of 20° C., and etching time of 30 minutes.

The average aperture size (short side×long side) of the via hole 11 on the overall surface of the substrate is 14 µm×65 µm, and the depth thereof is approx. 110 µm.

In the above process, the etching mask for dry etching is composed of the resist pattern 17 and the resist pattern 18, so that deformation of the resist pattern 18 may be restrained to the minimum. This enables the via hole 11 to decrease a quantity of an aperture size shift from the aperture size of the etching mask to approx. 1 µm in short side direction.

Also, post baking of the resist pattern 18 at approx. 90° C. enables achievement of high selectivity to GaAs that is a material of the GaAs substrate 16, enables dry etching for 30 minutes, and enables increase of the depth of the via hole 11 to 110 µm.

The thickness of the GaAs substrate 16 after back surface etching is determined by the depth of the via hole 11. In consideration of the strength of the GaAs substrate 16 after back surface etching, the GaAs substrate 16 preferably has a larger thickness. Therefore, the via hole 11 is required to be etched as deeply as possible.

Figure 6:
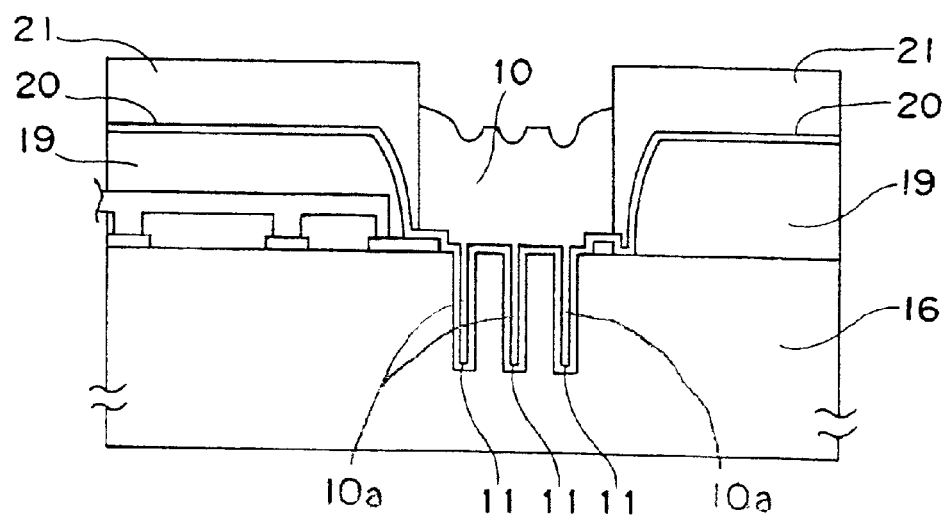
FIG. 6 is a cross sectional view showing one step of manufacturing the ground electrode in the first embodiment.

Next, as shown in FIG. 6, a resist pattern 19 for plating protection is formed with a negative resist. The resist pattern 19 for plating protection is for preventing plating of unnecessary part in plating operation.

Next, a Ti/Au metal feed layer 20 for plating feed is formed on the entire surface by sputtering. Here, the Ti/Au metal feed layer 20 is also sputtered on the inner wall of each via hole 11.

Next, a resist pattern 21 for forming the upper-layer ground electrode 10 is formed with a negative resist. Then, with the resist pattern 21 as a mask, electrolytic plating is conducted to form the upper-layer ground electrode 10, and the under-layer ground electrode 9 and the upper-layer ground electrode 10 are integrated.

Herein, the inner wall of the via hole 11 is coated with the Ti/Au metal feed layer 20, so that the metal feed layer 20 on the inner wall is plated with a metal for plating the upper-layer ground electrode 10. The plating is conducted till an aperture portion of the via hole 11 on the GaAs substrate 16 is completely blocked by the plated metal.

In this embodiment, with the plating thickness of the upper-layer ground electrode 10 being approx. 15 μm, the aperture portion of the via hole 11 on the GaAs substrate 16 is completely blocked by the plated metal.

In this embodiment, since there is formed the via hole 11 with an extremely high aspect ratio, it is necessary to completely block the aperture portion of the via hole 11 in the above-stated plating operation. In the case where the aperture portion of the via hole 11 is not completely blocked by the plate metal due to short plating time, a sufficiently thick metal is not plated on the bottom of the via hole 11. With such an incomplete blocking, if the back surface of the GaAs substrate 16 is excessively etched in an afterward back surface etching step, the back surface etching consumes the plated metal on the bottom of the via hole 11, thereby causing the plated metal penetrated by an etching area.

If the etching area for the back surface etching penetrates the plated metal on the bottom of the via hole 11, the back surface electrode 13 is not formed on the bottom of the via hole 11, thereby causing a problem of increased grounding resistance of the ground electrode 8.

Also, from the portion of the plated metal on the via hole 11 penetrated by the etching, a die bond material for mounting operation leaks out to the front surface of the GaAs substrate 16, which causes mounting failure of MMIC such as contamination of the MMIC formed on the GaAs substrate 16.

In plating operation, therefore, the aperture portion of the via hole 11 on the GaAs substrate 16 needs to be blocked by the plated metal, and precision of the back surface etching needs to be improved. This requires reduction of unevenness on the front surface of the GaAs substrate 16, for which it is effective for the via hole 11 to have an aperture with a short side size of 20 μm or less.

Next, there is conducted oxygen ashing of the resist pattern 21 shown in FIG. 6 for removing an alteration layer generated by plating liquid on the resist pattern 21, and the resist pattern 21 is removed by organic cleaning with use of acetone and the like.

Figure 7:
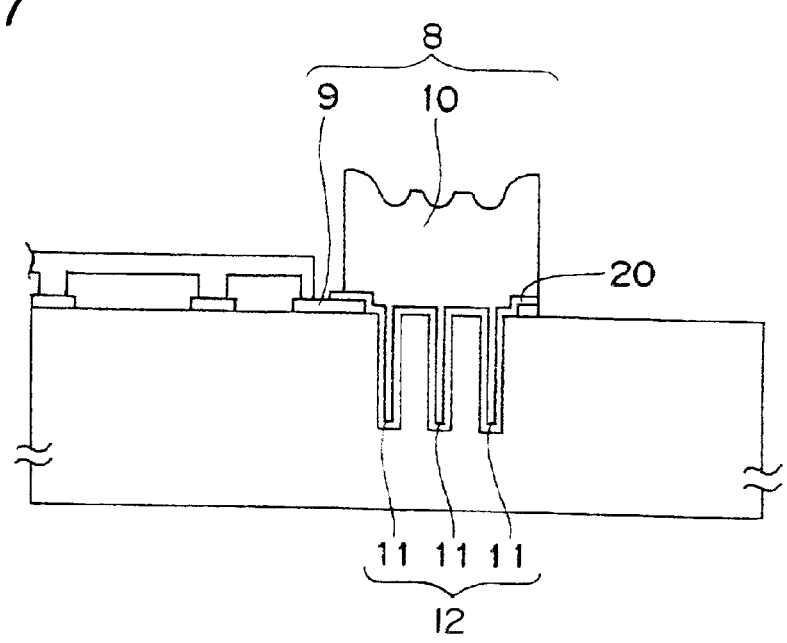
FIG. 7 is a cross sectional view showing one step of manufacturing the ground electrode in the first embodiment.

Then, as shown in FIG. 7, the Ti/Au metal feed layer 20 for plating feed is etched with an iodine-base etchant and a phosphoric acid-base etchant. Then, with a removing agent and the like, the resist pattern 19 for plating protection is removed.

It is noted that in this embodiment the resist pattern 19 for plating protection and the resist pattern 21 for forming the upper-layer ground electrode 10 are formed with negative resists, so that the resist materials in the via hole 11 may be completely removed.

Since the metal feed layer 20 needs to be formed on the resist pattern 19, the resist pattern 19 needs an aperture having a normal taper-shaped cross section as shown in FIG. 6. Consequently in this embodiment, a ZPN1100 resist made by ZEON Corporation is used as the resist pattern 19 and the resist pattern 21. The aperture having a normal taper-shaped cross section is obtained by baking the ZPN1100 resist made by ZEON Corporation at 120° C. or more.

Also, since the resist pattern 21 for forming the upper-layer ground electrode 10 is removed by organic cleaning with use of acetone and the like, the resist pattern 19 for plating protection needs tolerance to organic agents. The ZPN1100 resist made by ZEON Corporation (resist pattern 19) has characteristics of acquiring tolerance to organic agents by getting irradiation of UV (Ultraviolet) rays after baking at 210° C. as well as enabling easy removal with removing agents.

The resist pattern 21 for forming the upper-layer ground electrode 10 needs to be removed by organic cleaning with use of acetone and the like. The ZPN1100 resist made by ZEON Corporation may fulfill this need because it has a characteristic of enabling easy removal through organic cleaning with use of acetone and the like through baking at a temperature of 90° C. or less.

Further, the resist pattern 19 for plating protection and the resist pattern 21 for forming the upper-layer ground electrode 10 share the same resist material, which makes it possible to minimize kinds of resists used in the entire process to the minimum. Also, dedicated removal agents are not necessary, which enables restraint of increase of costs necessary for the process to the minimum.

Next, as shown in FIG. 2, with the GaAs substrate 16 being attached to the support substrate (unshown), the back surface of the GaAs substrate 16 is etched away till the plated metal 10a for the upper-layer ground electrode 10 inside the via hole 11 is exposed.

Further, the back surface electrode 13 is formed on the entire surface to complete the MMIC. Herein, the thickness of the substrate 16 is approx. 100 μm.

Furthermore, the MMIC is mounted on a ceramic substrate. A silver paste is used as a die bond material. Since the aperture portion of the via hole 11 is completely blocked by the plated metal 10a for forming the upper-layer ground electrode 10, there is generated no mounting failure such as leakage of the silver paste to the surface of MMIC through the via hole 11.

A ground inductance of the ground electrode 8 including the via hole group 12 of the present embodiment was measured from a test element group formed together with the MMIC. The result indicated that the ground inductance was 8.5 pH (Pico Henry).

A ground inductance of a ground electrode having a single via hole (aperture size of 65 μm×65 μm) that enables formation of a ground electrode of the same area was also measured from the test element group formed together with the MMIC. The result indicated that the ground inductance was 13.5 pH.

It is considered that the above measurement results are not obtained only by the effect of disposing the via holes in parallel unlike the conventional ground electrode having a single via hole. More particularly, providing a via hole group 12 consisting of adjacently formed minute via holes 11, 11, 11 like the present embodiment brings about adjacent formation of plated metals 10a inside the minute via hole 11, the interaction of which generates high frequency electromagnetic bonding, resulting in further reduction of the inductance.

According to the embodiment, use of the ground electrode 8 including a via hole group 12 consisting of three minute via holes 11 enables reduction of the ground inductance by approx. 37% without changing the area of MMIC. As a result, a gain of MMIC (see FIG. 1) in 2 GHz in this embodiment is increased by 3 dB compared to the conventional MMIC having a ground electrode including a single via hole.

It is noted that the ground electrode 8 included in the MMIC of the first embodiment that is capable of providing an effect of reducing the ground inductance by the electromagnetic bonding is not limited to those manufactured by the above-described manufacturing method.

(Second Embodiment)

Figure 9:
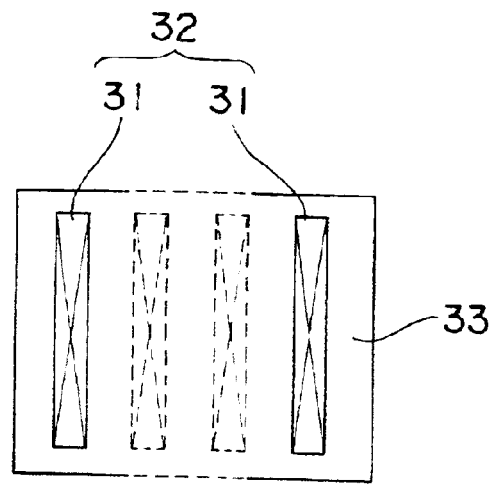
FIG. 9 is a plane view showing a ground electrode included in the second embodiment of the present invention.
Figure 10:
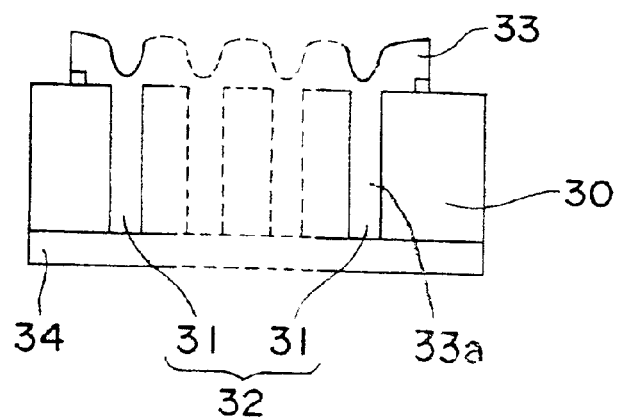
FIG. 10 is a cross sectional view showing a ground electrode included in the third embodiment of the present invention.

Description will now be given of the second embodiment of the present invention with reference to FIG. 9 and FIG. 10. As shown in a plane view of FIG. 9 and a cross sectional view of FIG. 10, the second embodiment is composed of a via hole group 32 made up of X unit numbers of via holes 31 formed on a GaAs substrate 30. The X unit numbers of via holes 31 are provided with a rectangle aperture and disposed adjacently so that each long side of the aperture faces in the direction orthogonal to the long side. The X unit numbers of the via holes 31 are filled with a metal 33a constituting a ground electrode 33. The metal 33a is connected to a back surface electrode 34 formed on the back surface of the GaAs substrate 30. The structure except the via hole 31 and the ground electrode 33 may be identical to the structure of, for example, the aforementioned first embodiment.

EXPERIMENTAL EXAMPLE

In the second embodiment, there is manufactured a test element group of the ground electrode 33 with the unit number X of the via holes 31 included in the via hole group 32 as a parameter, to measure an inductance of the ground electrode 33.

Herein, the aperture of a single via hole 31 has a short side×long side size of 13 μm×65 μm. A distance between the long sides of the facing via holes 31 is 13 μm. The ground electrode 33 has a size in the direction of the long side of the via hole 31 of 75 μm, and a size in the direction of the short side of the via hole of {5 μm+(13 μm×X)+[13 μm×(X−1)]+5 μm}, where X denotes the unit number X of the via holes 31 having an aperture on the GaAs substrate 30 included in the via hole group 32.

The thickness of the plated metal of the ground electrode 33 is 12 μm. The back surface of the GaAs substrate 30 is etched away till the thickness of the GaAs substrate finally becomes 100 μm. As a back surface electrode 34, an Au metal is plated by a thickness of 20 μm.

Figure 8:
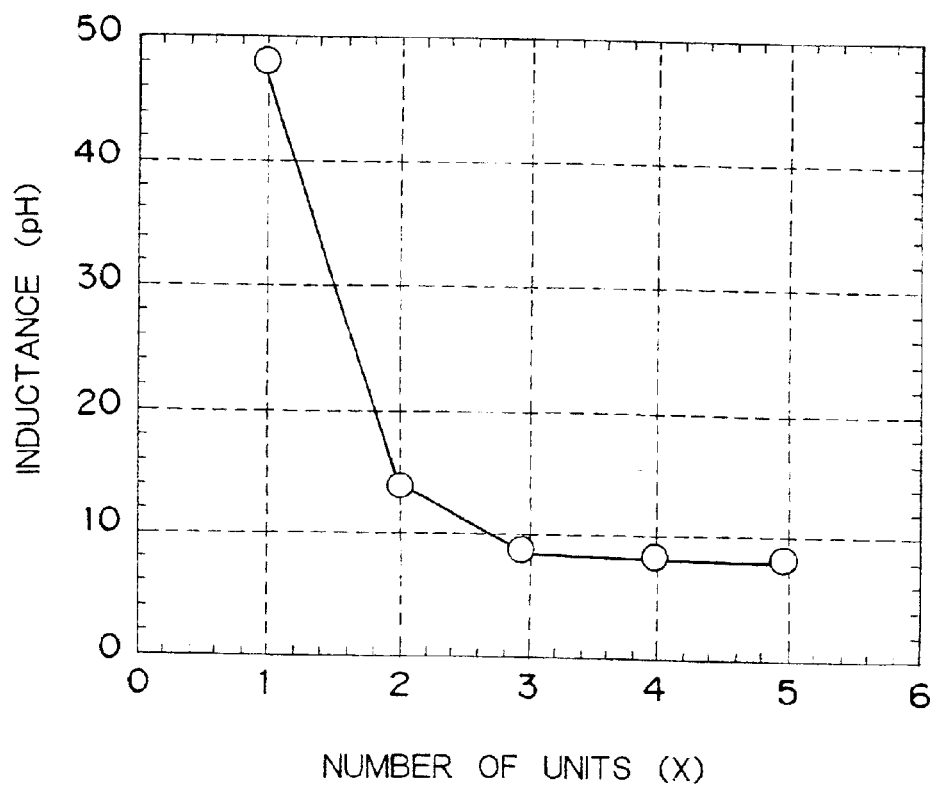
FIG. 8 is a characteristic view showing relationship between the number of via holes constituting one via hole group and a ground inductance.

FIG. 8 shows experimental ground inductance values of the ground electrode 33 of the test element group with the unit number X of the via holes 31 included in the via hole group 32 as a parameter. As shown in FIG. 8, compared to the inductance of the ground electrode in the case where the via hole group 32 consists of one single via hole 31, the inductance of the ground electrode in the case where the via hole group 32 consists of two via holes 31 may be reduced to 50% or lower.

This achievement is inexplicable only by an effect obtained by simply increasing the unit number of the via holes 31 included in the via hole group 32 from one to two-fold two. More particularly, it is considered that plated metals 33a inside the via holes 31 are formed adjacently, which generates electromagnetic bonding, thereby bringing about the effect of reducing the inductance.

However, as shown in FIG. 8, it is indicated that up to three unit numbers of the via holes 31 bring about the effect of reducing the inductance by electromagnetic bonding, which is larger than the effect obtained simply by increasing the unit number X of the via holes, though four or more unit numbers do not show the remarkable reduction effect.

It is noted that an additional experiment indicates that the effect considered to be attributed to electromagnetic bonding is independent of an aperture size of a single via hole on the GaAs substrate, a plated metal thickness of the ground electrode, and a thickness of the substrate. In consideration of the fact that larger unit numbers of the via holes included in a via hole group increases the size of the ground electrode, the number of the via holes included in the via hole group is preferably two or three.

(Third Embodiment)

Description will now be given of the structure of a ground electrode 43 and a via hole group 42 included in the third embodiment of the present invention with reference to FIG. 12 and FIG. 13. In this third embodiment, two via holes 41, 41 are formed on a GaAs substrate 40, and these two via holes 41 constitute a via hole group 42. The ground electrode 43, which is formed in a rectangle shape on the GaAs substrate 40, covers the via hole group 42, and includes a metal 43a filled in the via hole 41. On the back surface of the GaAs substrate 40, there is formed a back surface electrode 44, which is connected to the metal (plated metal) 43a filled in the via holes 41. The structure except the via hole 41 and the ground electrode 43 may be identical to the structure of, for example, the aforementioned first embodiment.

EXPERIMENTAL EXAMPLE

In the third embodiment, there is manufactured a test element group with a space between the above two via holes 41 in short side direction as a parameter, to measure an inductance of the ground electrode 43.

Figure 12:
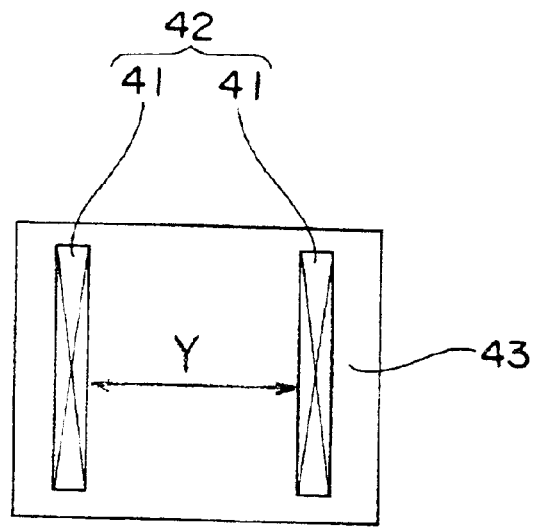
FIG. 12 is a plane view showing a ground electrode included in the third embodiment of the present invention.
Figure 13:
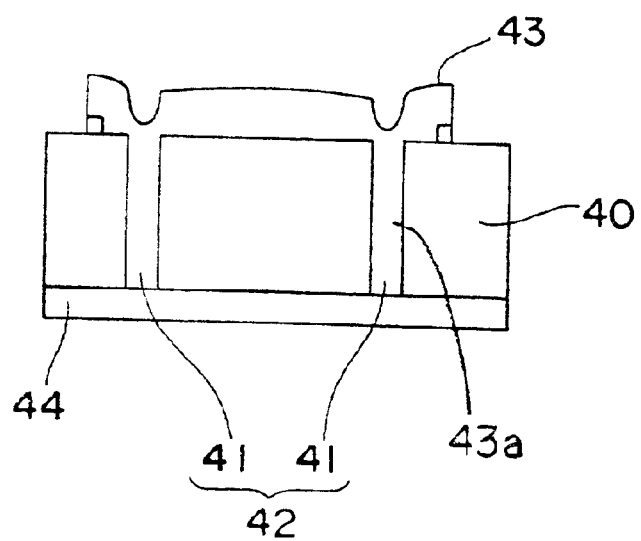
FIG. 13 is a cross sectional view showing a ground electrode included in the third embodiment of the present invention.

As shown in a plane view of FIG. 12, the aperture of a single via hole 41 has a short side×long side size of 13 μm×65 μm. A space between the via holes 41 is a parameter Y μm. The ground electrode 43 has a size in the direction of the long side of the via hole 41 of 75 μm, and a size in the direction of the short side of the via hole of {5 μm+13 μm+Y my+13 μm+5 μm}, where the size Y μm denotes a distance between long sides of two facing via holes 41. The thickness of the plated metal of the ground electrode 43 is 12 μm. Finally, the back surface of the GaAs substrate 40 is etched so as to make the thickness of the GaAs substrate 40 to be 100 μm. As a back surface electrode 44, an Au metal is plated by a thickness of 20 μm.

Figure 11:
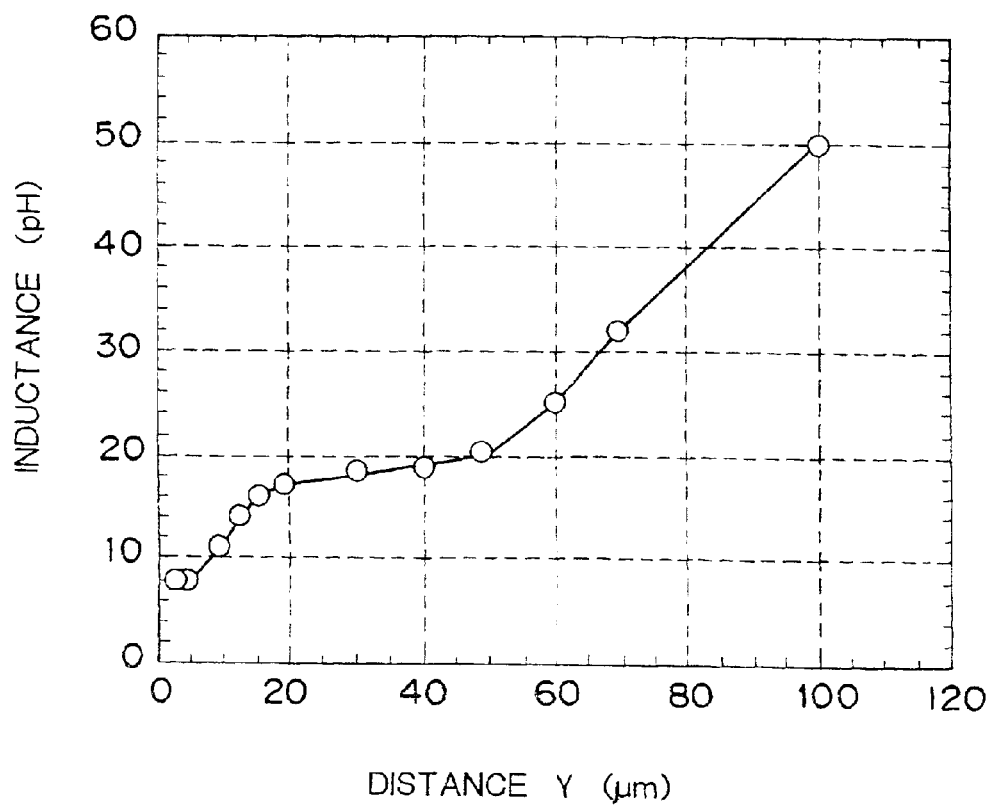
FIG. 11 is a characteristic view showing relationship between a distance between two via holes constituting one via hole group and a ground inductance.

FIG. 11 shows experimental inductance values of the test element group with a distance Y μm between the facing long sides of two via holes 41 as a parameter.

As shown in FIG. 11, it is indicated that setting the distance Y between two via holes 41 to be 20 μm or smaller brings about particularly large effect of reducing the inductance of the ground electrode 43. The effect is considered to be attributed to fairly strong electromagnetic bonding generated by considerable adjacency of plated metals 43a inside the two via holes 41 on the GaAs substrate 43.

In the case where the distance Y between the two via holes 41 is set to be 20 μm or more and 50 μm or less, dependence of the inductance of the ground electrode 43 on the distance between the via holes 41 becomes relatively small. The result of the excrement indicates that with such distances Y, electromagnetic bonding between the plated metals 43a in the via holes 41 is in a weak state. However, the effect of reducing the inductance by this state of electromagnetic bonding is sufficient in terms of an absolute value of the inductance, and also dependence on the distance Y between the via holes 41 is small, which provides a merit that the distance Y is freely settable in this range (20 μm to 50 μm).

Further, if the distance Y between the two via holes 41 is set to be 60 μm or more, electromagnetic bonding between the metals (plated metals) 43a in the two via holes 41 almost disappears, and therefore a merit for disposing a plurality of the via holes 41 for reducing the inductance is considered to be impaired.

(Fourth Embodiment)

Figure 14:
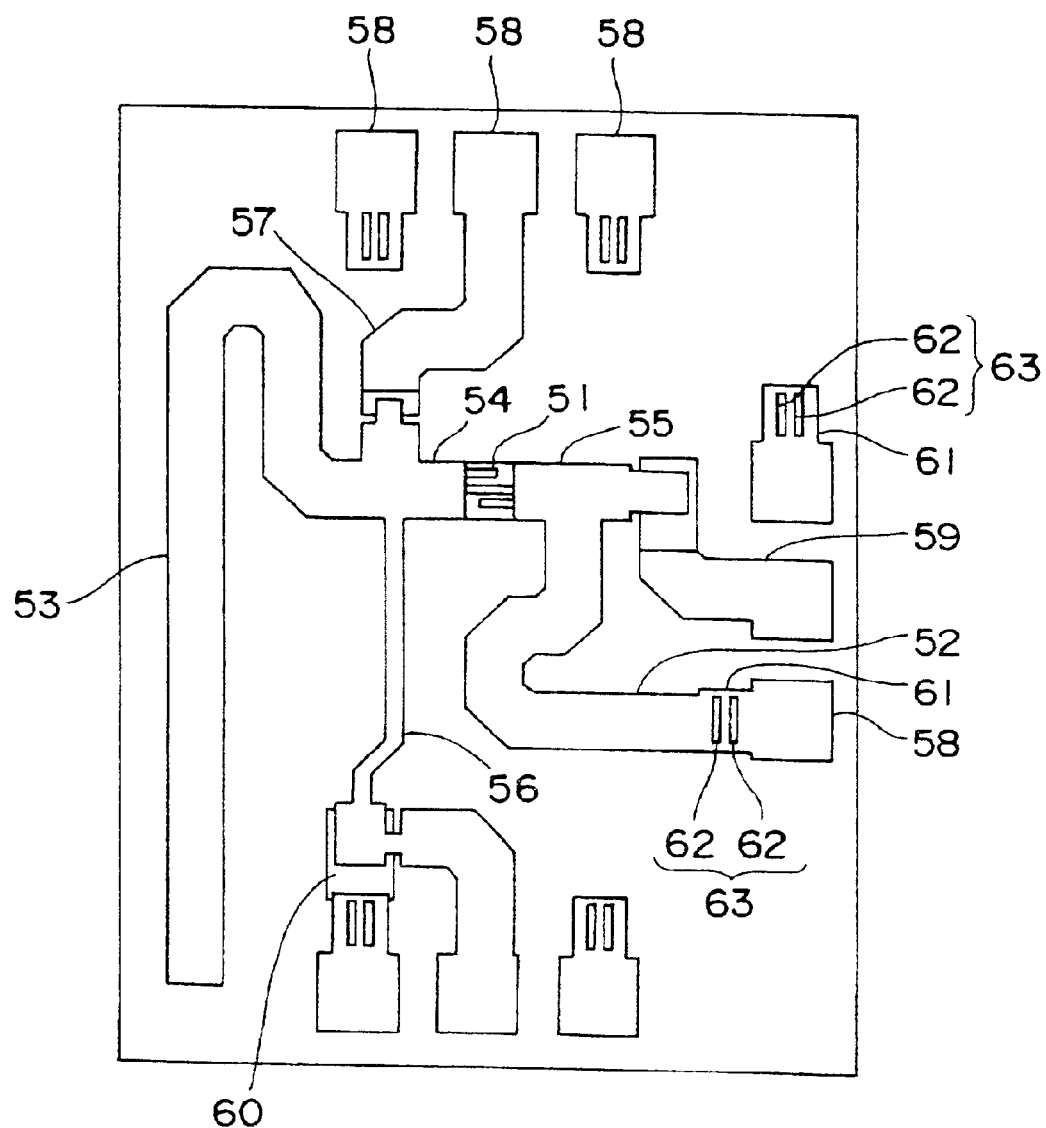
FIG. 14 is a plane view showing the structure of a harmonic mixer MMIC for millimeter band application in the fourth embodiment of the present invention.

FIG. 14 is a plane view showing the structure of a harmonic mixer GaAs MMIC semiconductor device for millimeter band application. The semiconductor device includes a microstrip line and is characterized by a ground electrode that is a contact point of a short-circuit stub.

As shown in FIG. 14, the GaAs MMIC in the fourth embodiment is composed of an anti-parallel diode pair (APDP) 51 connected in parallel with polarity of each diode reversed, a short-circuit stub 52, an open stub 53, a first transfer line 54, a second transfer line 55, an intermediate frequency signal transfer line 56, a high frequency signal transfer line 57, a probe electrode 58, a local oscilation signal transfer line 59, and an MIM capacitor 60. For example, the short-circuit stub 52 is formed with an end thereof being integrated with a back surface electrode 50 (see FIG. 20) through a ground electrode pad 61 and a via hole group 63 consisting of two via holes 62.

Description will now be given of a manufacturing method in a peripheral region of the via hole group 63 and the ground electrode pad 61 included in a semiconductor device of the present embodiment with reference in sequence to the cross sectional views of FIGS. 15 to 20.

Figure 15:
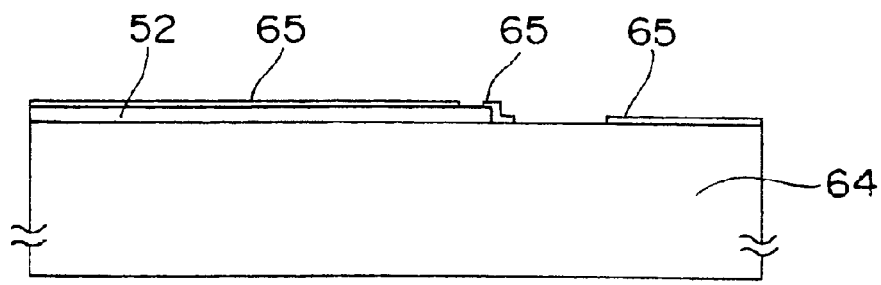
FIG. 15 is a cross sectional view showing one step of manufacturing a ground electrode included in the fourth embodiment.

FIG. 15 shows part of the short-circuit stub 52 and an end portion thereof. In the state shown in FIG. 15, there are formed components except a back surface electrode 50, a ground electrode pad 61 with via holes 62 disposed, and a probe electrode 58. As shown in FIG. 15, on a GaAs substrate 64 with a thickness of 600 μm, there is formed a short-circuit stub 52. On the short-circuit stub and the substrate 64, there is formed an insulating film 65.

Figure 16:
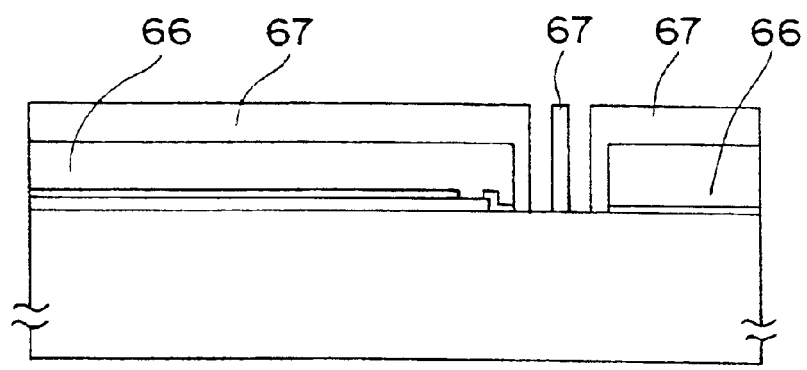
FIG. 16 is a cross sectional view showing one step of manufacturing a ground electrode included in the fourth embodiment.

Next, as shown in FIG. 16, a positive resist is applied to form a resist pattern 66 having an aperture area slightly larger than the area for forming a via hole group.

Then, on the resist pattern 66, a positive resist is applied to form a resist pattern 67 for forming a via hole, and post exposure baking (PEB) is performed at approx. 110° C. for improving tolerance to dry etching.

As shown in FIG. 14, the via hole group 63 consists of two via holes 62, each of which has a rectangle (oblong) aperture with a short side×long side size of 20 μm×60 μm. Each of the via holes 62 is disposed in parallel so that each long side of the aperture faces to each other in an extending direction of the short side thereof, i.e., a direction orthogonal to the long side. A distance between the long sides of the facing via holes 62 is 20 μm.

Description is herein given of an advantage of forming the resist pattern 66 having an aperture area slightly larger than the area for forming the via hole group 63.

As a resist pattern 67 for forming the via hole 62, a thick resist is used so as to enable etching operation for a long period of time. However, the thickened resist pattern 67, if having a large area, suffers deformation caused by stress generated inside the resist by a thermal influence during and after pattern formation.

With the deformation of the resist pattern 67, the aperture size of the via hole 62 largely exceeds a design value. The deformation is considered to be attributed to the fact that a larger area of a thick resist pattern 67 increases the area of the resist pattern 67 in contact with the substrate 64 or with an insulating film as a substrate, which increases stress between the substrate 64 or the insulating film and the resist pattern 67. Accordingly, in order to prevent the deformation of the resist pattern 67, the stress between the substrate 64 and the resist pattern 67 needs to be decreased. For decreasing the stress of the resist pattern 67, it is effective to decrease the area of the substrate 64 in contact with the resist pattern 67.

The result of our experiment indicates that using other resists as a front end of the resist pattern 67 may decrease the stress, and thereby diminish deformation of the resist pattern 67.

In this embodiment, an OFPR800 150CP resist made by Tokyo Ohka Kogyo Co., Ltd. is used as a resist pattern 66, while an AZP4903 resist made by Clariant (Japan) K.K. is used as a resist pattern 67. The OFPR800 150CP resist made by Tokyo Ohka Kogyo Co., Ltd. makes it easy to make the resist pattern 66 to have a normal taper-shaped aperture cross section through excessive expose and excessive development, which enables effective decrease of the stress from the resist pattern 67. The AZP4903 resist made by Clariant (Japan) K.K. has a characteristic as described before.

Figure 17:
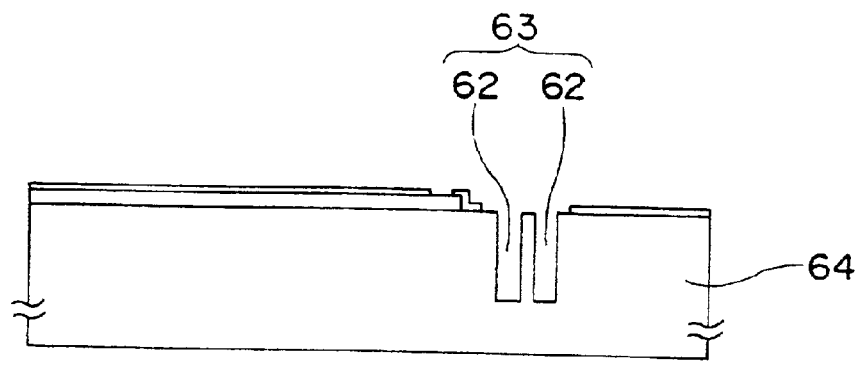
FIG. 17 is a cross sectional view showing one step of manufacturing a ground electrode included in the fourth embodiment.

Next, with use of the resist pattern 67 in the area for forming the via hole group 63 as a mask, dry etching of the GaAs substrate 64 is conducted by an ICP etching unit to form two via holes 62 as shown in FIG. 17.

Here, the ICP etching unit is provided with the etching conditions of $Cl_2$(40 sccm)+$SiCl_4$(40 sccm) used as mixed gas, pressure of 30 Torr in an etching chamber, substrate temperature of 20° C., and etching time of 30 minutes.

Here, the average short side×long side aperture size of the via hole 62 on the overall surface of the substrate 64 is 20 μm×60 μm, and the depth thereof is approx. 125 μm. In the above etching process, a mask for dry etching is of two-layer structure composed of the resist pattern 66 and the resist pattern 67, which may effectively relax the stress between the resist pattern 67 and the resist pattern 66, thereby preventing deformation of the resist pattern 67. This makes it possible to form the aperture of the via hole 62 with a size almost identical to an aperture size of the resist pattern 67.

Thus, the aperture of the via hole 62 can be formed with the size that is free from a shift from an aperture size of the resist pattern 67, which makes it possible to conform an inductance of the via hole 62 to a designed value and to manufacture an MMIC semiconductor device having desired characteristics, thereby achieving an improved yield.

Also, post exposure baking (PEB) of the resist pattern 66 at approx. 110° C. enables achievement of rather high selectivity to GaAs, a material of the GaAs substrate 64. This enables dry etching for 30 minutes for forming the via hole 62, and enables increase of the depth of the via hole 62 to 125 μm. Since the depth of the via hole 62 determines the thickness of the GaAs substrate 64 after etching of the GaAs substrate 64, deep etching is necessary in consideration of the strength of the substrate 64.

After the dry etching is conducted, the resist pattern 66 and the resist pattern 67 are removed by a removing agent and the like.

Figure 18:
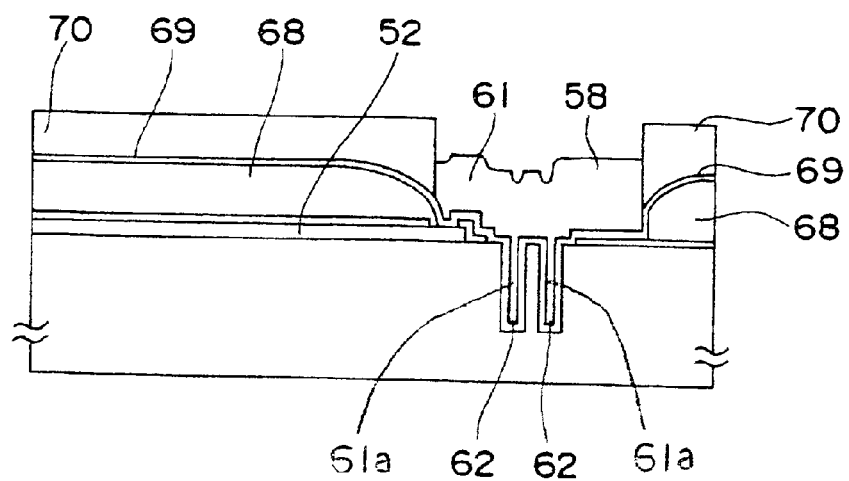
FIG. 18 is a cross sectional view showing one step of manufacturing a ground electrode included in the fourth embodiment.

Next, as shown in FIG. 18, a resist pattern 68 for plating protection is formed with a negative resist on the insulating film 65 and the substrate 64 in order to prevent plating of unnecessary part in plating operation. Then, a Ti/Au metal feed layer 69 for plating feed is formed on the entire surface by sputtering, and again a resist pattern 70 is formed with a negative resist for forming a ground electrode pad 61.

Next, with use of the resist pattern 70 for forming the ground electrode pad 61 as a mask, electrolytic plating is conducted to form the ground electrode pad 61, which is connected to a short-circuit stub 52. In this fourth embodiment, the ground electrode pad 61 and a probe electrode 58 are integrally formed at the same time.

The Ti/Au metal feed layer 69 for feeding electricity for plating is sputtered on the inner wall of the via hole 62, so that the inner wall of the via holes 62 is plated with a metal when the ground electrode pad 61 is formed by the electrolytic plating.

In this fourth embodiment, electrolytic plating is conducted till an aperture portion of the via hole 62 is completely blocked as with the aforementioned embodiment. In the fourth embodiment, the aperture portion of the via hole 62 is completely blocked when the ground electrode pad 61 is provided with a plating thickness of approx. 20 μm.

Next, there is conducted oxygen ashing of the resist pattern 70 for forming the ground electrode pad 61 and the probe electrode 58 shown in FIG. 18, to remove an alteration layer generated by plating liquid on the resist pattern 70, and the resist pattern 70 is removed by organic cleaning with use of acetone and the like.

Figure 19:
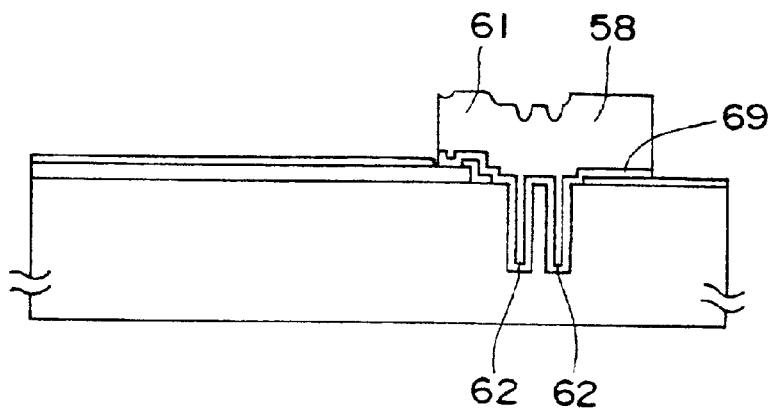
FIG. 19 is a cross sectional view showing one step of manufacturing a ground electrode included in the fourth embodiment.

Then, the Ti/Au metal feed layer 69 for plating feed is etched with an iodine-base etchant and a phosphoric acid-base etchant. Then, with a removing agent and the like, the resist pattern 68 for plating protection is removed. Thus, the structure shown in FIG. 19 is obtained.

It is noted that in this embodiment the resist pattern 68 for plating protection and the resist pattern 70 for forming the ground electrode pad 61 shown in FIG. 18 are formed with negative resists, so that the resist materials in the via hole 62 may be completely removed.

Figure 20:
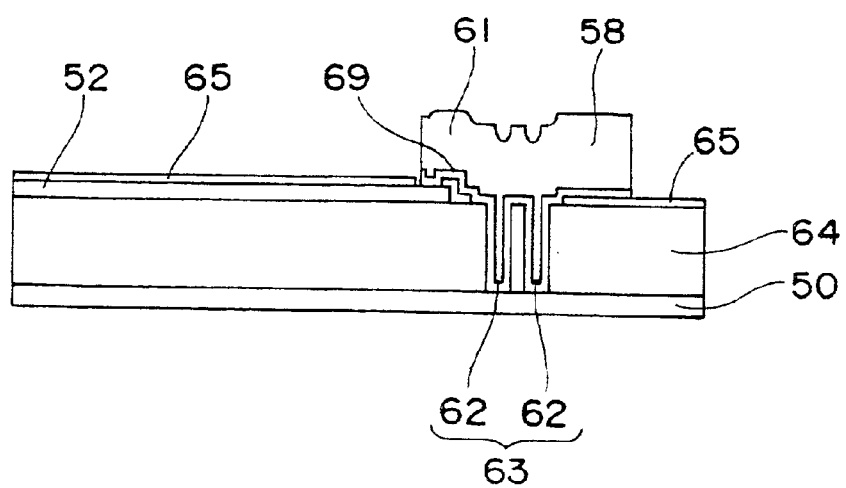
FIG. 20 is a cross sectional view showing one step of manufacturing a ground electrode included in the fourth embodiment.

Next, as shown in FIG. 20, with the GaAs substrate 64 being attached to a support substrate, the back surface of the GaAs substrate 64 is etched away till a plated metal feed layer 69 in the via hole 62 is exposed. Further, on the entire surface of the GaAs substrate 64, there is formed a back surface electrode 50, which is connected to a plated metal 61a in the via hole 62 to complete the MMIC. Herein, the thickness of the GaAs substrate 64 is approx. 100 μm.

Furthermore, the MMIC is mounted on a ceramic substrate. A silver paste is used as a die bond material. According to the embodiment, since the via hole 62 is filled with the plated metal 61a, there is generated no mounting failure such as leakage of the silver paste.

A ground inductance of the ground electrode pad 61 having the via hole group 63 of the fourth embodiment was measured from a test element group formed together with the MMIC. The result indicated that the ground inductance was 11 pH (Pico Henry), indicating sufficient reduction of the inductance compared to the conventional ground electrode having a single via hole.

A harmonic mixer MMIC for millimeterwave band applications of the present invention was functioned as an upconverter for receiving an input of a 1 GHz intermediate frequency signal and sending out an output of a 60 GHz high frequency signal, for measuring a characteristic thereof. As a result, in the range of an input power of the intermediate frequency signal in practical application, 2 dB or more output power of the high frequency signal was obtained compared to the conventional structure. This result is considered to be obtained because the ground electrode pad 61 of the present invention was used as a short-circuit stub 52, which makes it possible to obtain a desired ground inductance value as well as to implement sufficient reduction of the ground inductance, thereby providing a sufficiently decreased conversion loss and improved output to the MMIC of the present invention.

(Fifth Embodiment)

Figure 21:
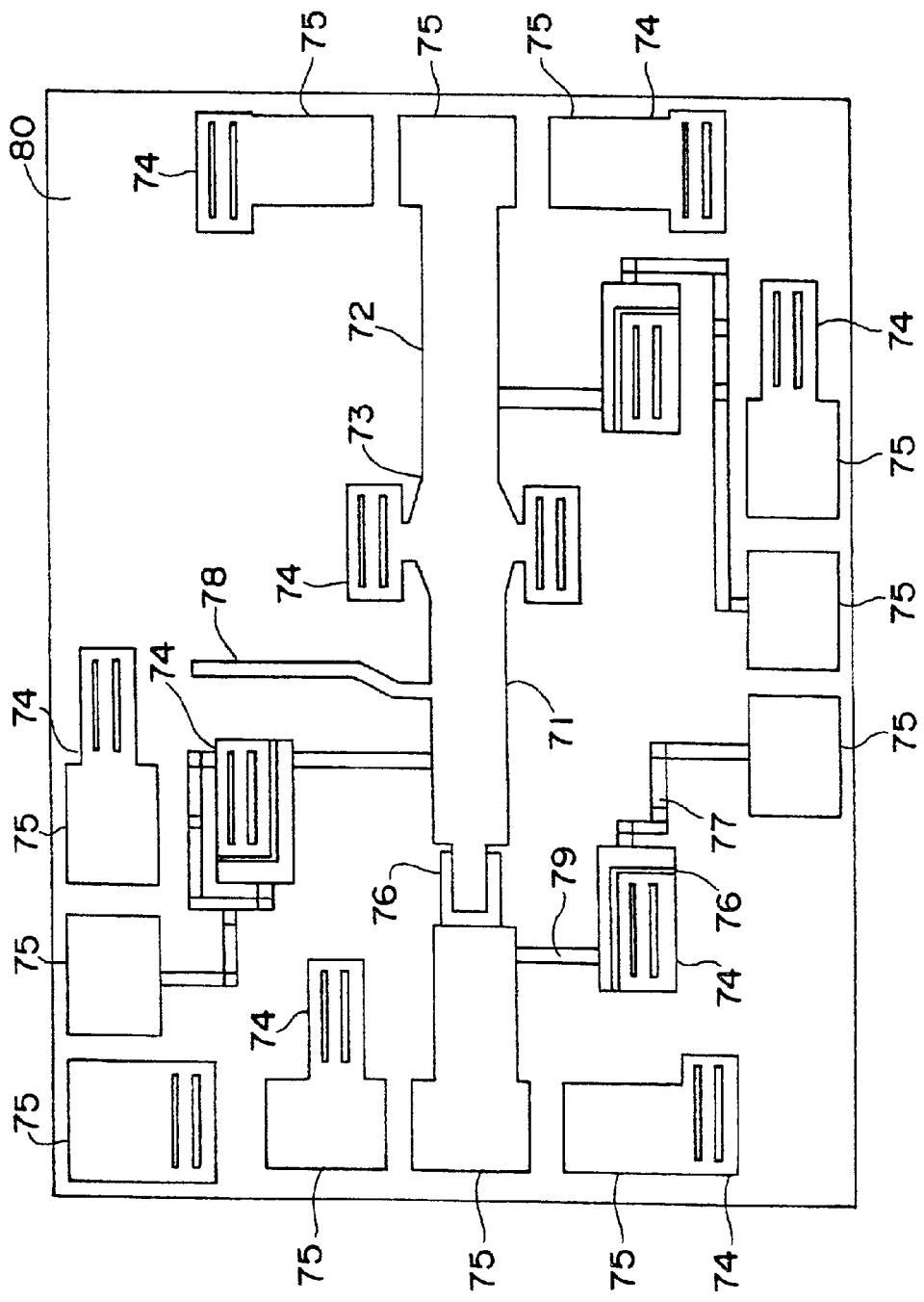
FIG. 21 is a plane view showing the structure of an amplifier MMIC for millimeter band application in the fifth embodiment of the present invention.

In a plane view of FIG. 21, there is shown the structure of an amplifier GaAs MMIC for millimeterwave band applications embodying an semiconductor device of the fifth embodiment of the present invention.

As shown in FIG. 21, a GaAs MMIC in the present embodiment is composed of a first transfer line 71, a second transfer line 72, an HBT element 73, a via hole group 74, a high-frequency probe pad electrode 75, an MIM capacitor 76, a resistive element 77, an open stub 78, and a short-circuit transfer line 79.

Figure 22:
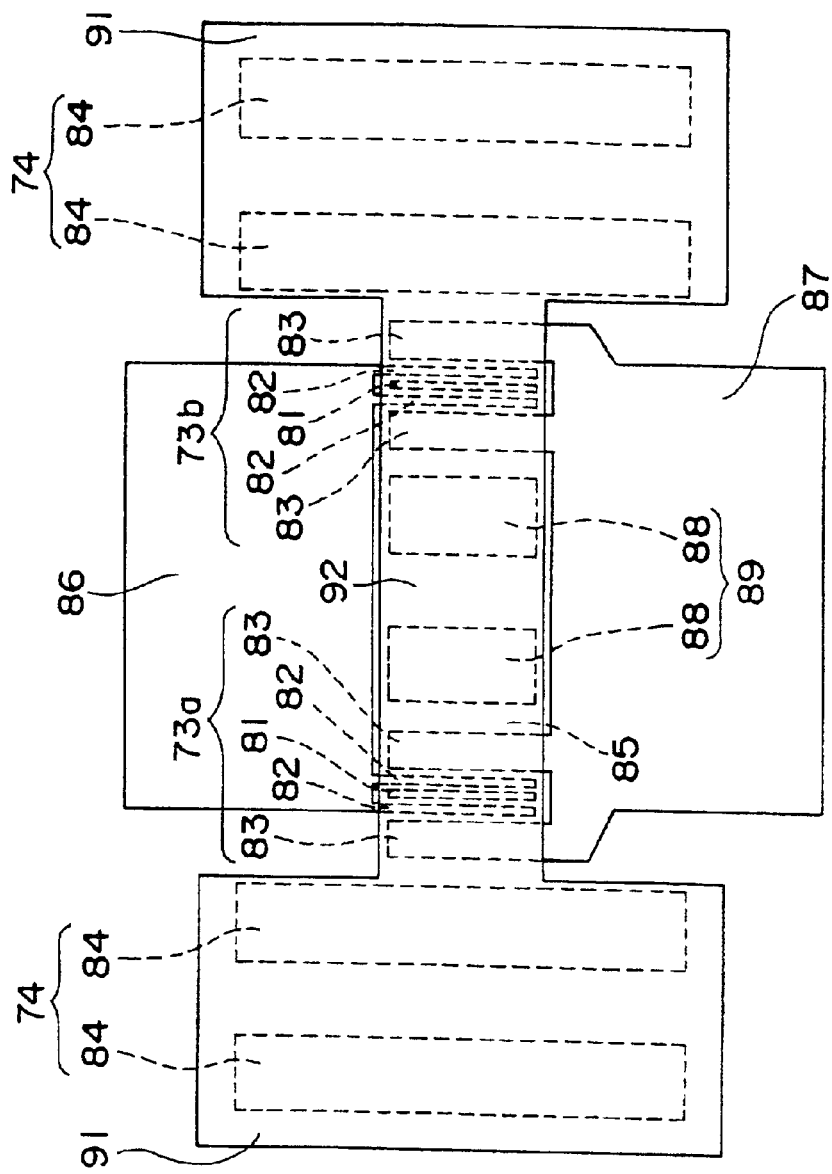
FIG. 22 is a plane view showing a semiconductor element included in the fifth embodiment.
Figure 23:
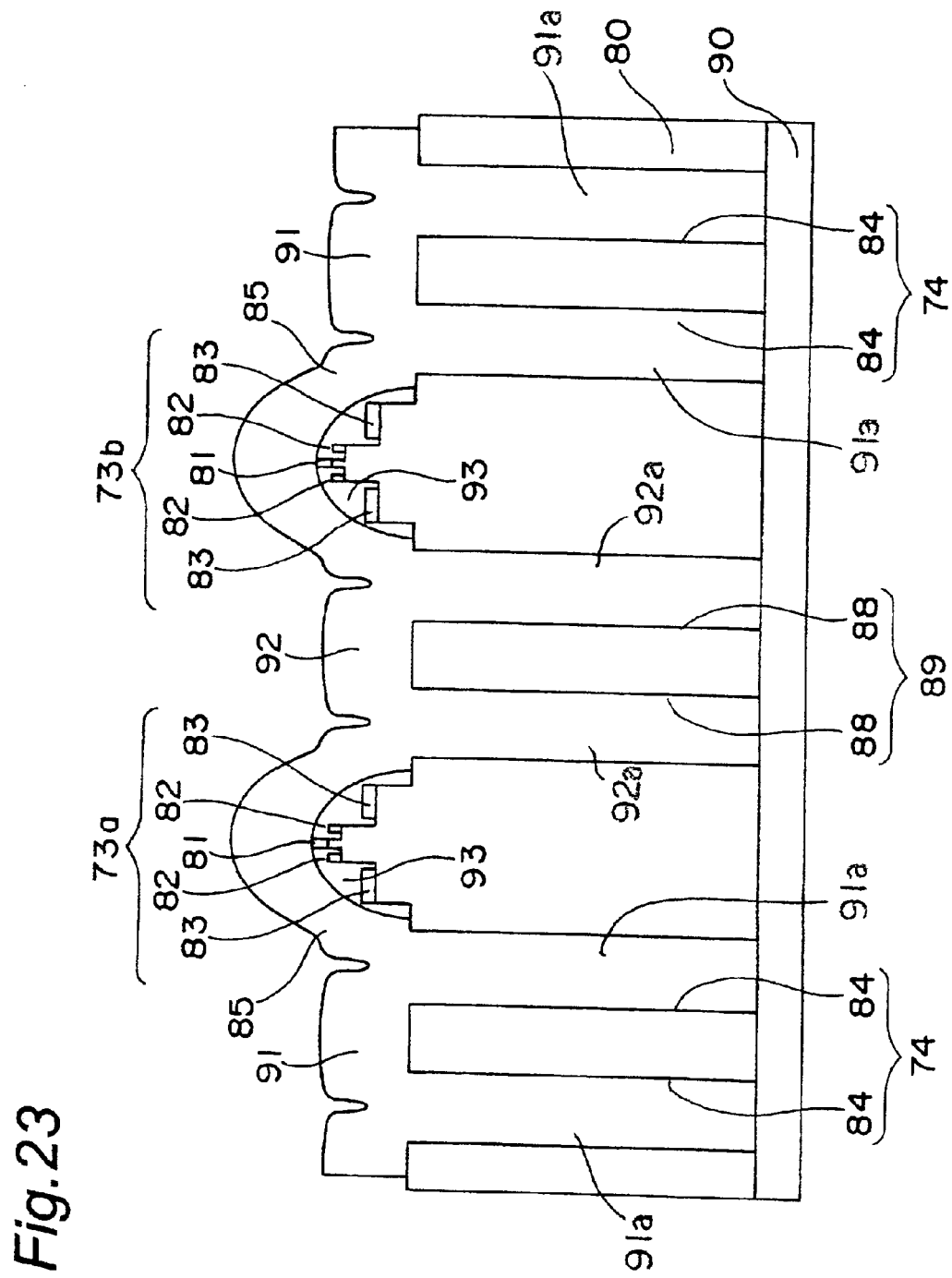
FIG. 23 is a cross sectional view showing a semiconductor element included in the fifth embodiment.

FIG. 22 is a partially enlarged plane view showing the structure of a peripheral part of the HBT element 73 of the GaAs MMIC for millimeterwave band applications, and FIG. 23 is a cross sectional view showing the structure of a peripheral part of the HBT element 73.

The HBT element 73 of the GaAs MMIC of the present embodiment is composed of two single HBT elements 73a and 73b as shown in FIG. 22. Each of the HBT elements 73a and 73b has one emitter electrode 81.

Each of the single HBT elements 73a and 73b is made up of one emitter electrode 81, two base electrodes 82, and two collector electrodes 83.

As shown in FIG. 23, these two single HBT elements 73a and 73b each have the emitter electrode 81 connected via an emitter interconnection 85. Further, as shown in FIG. 22, each base electrode 82 is connected via a base interconnection 86. Also as shown in FIG. 22, each collector electrode 83 is connected via a collector interconnection 87. In this way, the HBT elements 73a and 73b are connected in parallel.

The HBT element 73 includes a via hole group 74 consisting of two via holes 84, and an inter-element via hole group 89 consisting of two inter-element via holes 88, 88 disposed between the single HBT elements 73a and 73b.

As shown in FIG. 23, the emitter interconnection 85, which connects two emitter electrodes 81 of the single HBT elements 73a and 73b, is formed integrally with a ground electrode 91 and an inter-element ground electrode 92. The ground electrode 91 includes a via hole group 74 consisting of two via holes 84 connected to a back surface electrode 90. The inter-element ground electrode 92 includes an inter-element via hole group 89 consisting of two inter-element via holes 88 connected to the back surface electrode 90.

The emitter interconnection 85 is spatially separated from the base electrodes 82 and the collector electrodes 83 by a polyimide pattern 93.

The manufacturing method in the fifth embodiment will be further described in detail with reference in sequence to the cross sectional views of FIGS. 24 to 27.

Figure 24:
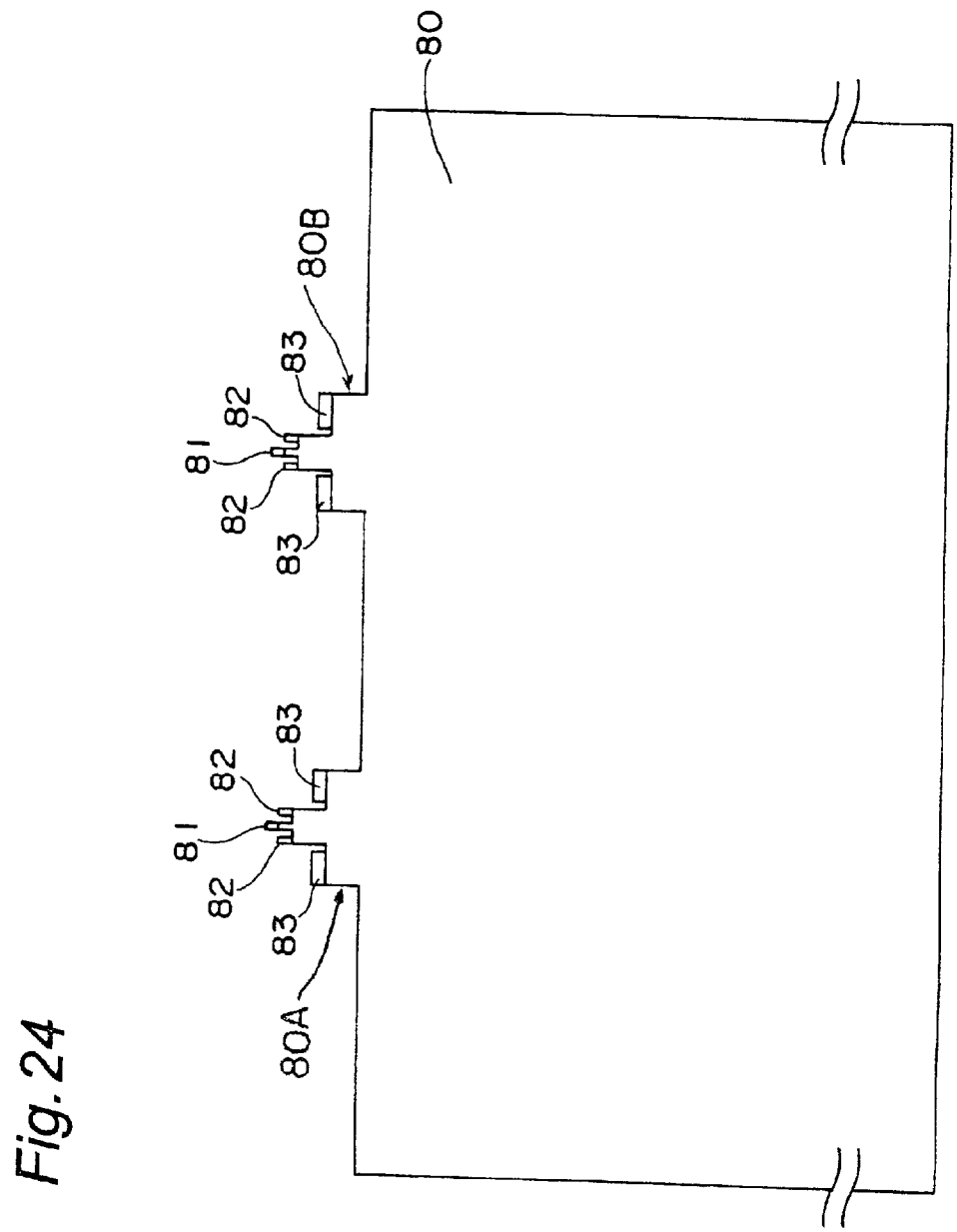
FIG. 24 is a cross sectional view showing one step of manufacturing the semiconductor element included in the fifth embodiment.

First, as shown in FIG. 24, on a GaAs substrate 80 with a thickness of 600 μm, there are formed two step-shaped mesas 80A and 80B, and on each of the mesas 80A and 80B, there are formed an emitter electrode 81, base electrodes 82, collector electrodes 83, a base interconnection, and a collector interconnection.

Figure 25:
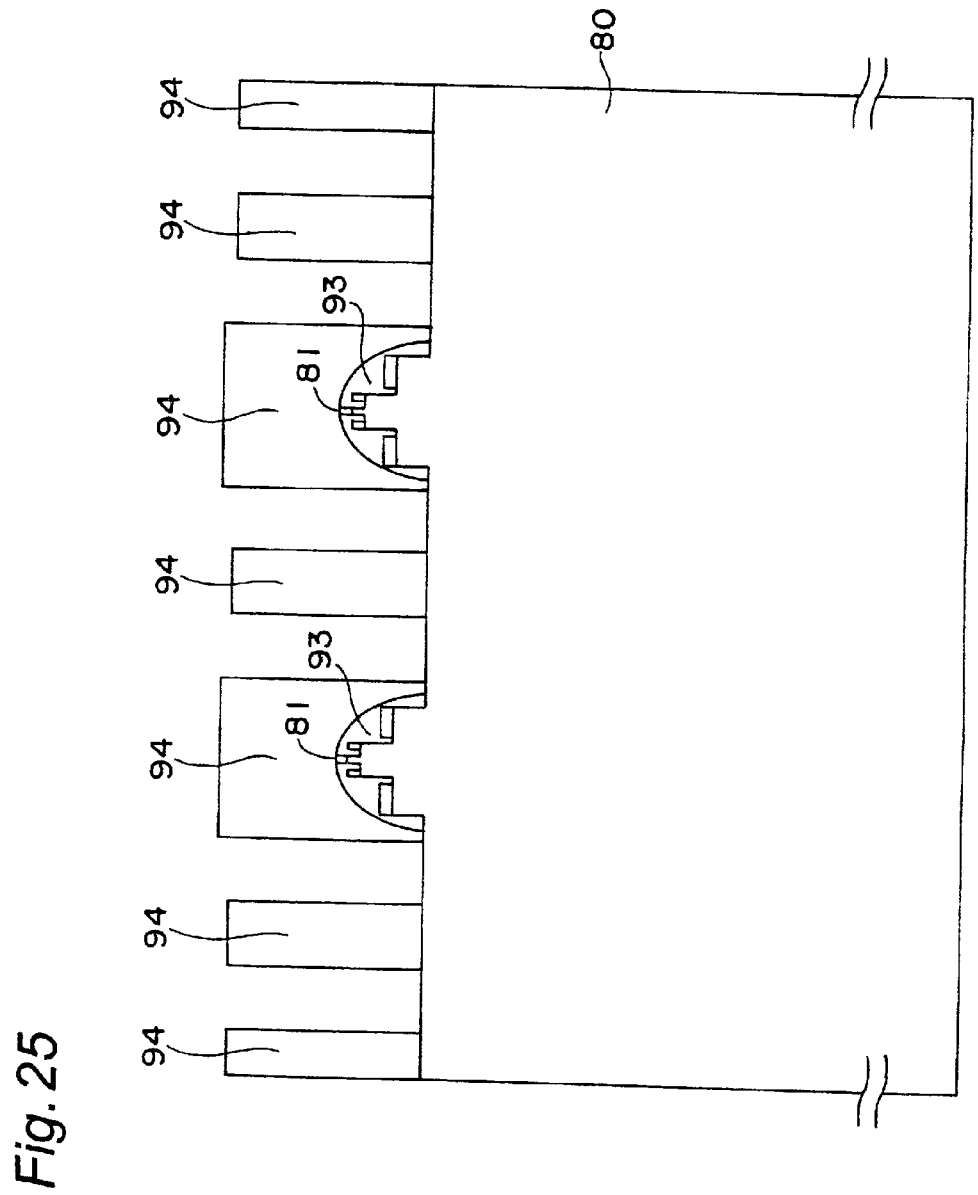
FIG. 25 is a cross sectional view showing one step of manufacturing the semiconductor element included in the fifth embodiment.

Next, as shown in FIG. 25, a polyimide is applied on the mesas 80A and 80B on the substrate 80 to form a polyimide pattern 93 that covers the entire single HBT elements except the top of the emitter electrode 81. After that, the polyimide pattern 93 is heat-treated so that a cross section of the polyimide pattern 93 will be smoothed. Then, a positive resist is applied thereon to form a resist pattern 94 for forming a via hole 84.

Next, post exposure baking (PEB) of the resist pattern 94 is conducted at approx. 110° C. to increase tolerance to dry etching.

Each of the via hole groups 74 consists of two via holes 84, and each via hole 84 has an aperture in the shape of a rectangle with a short side×long side size of 10 μm×60 μm. The via holes 84 are disposed in parallel two by two in an extending direction of the short side of the aperture (i.e., a direction orthogonal to the long side) so that the long sides thereof face to each other. A distance between two facing long sides of each two via holes 84 is 10 μm.

The inter-element via hole 88 has an aperture with a short side×long side size of 10 μm×20 μm. The inter-element via holes 88 are disposed in parallel two by two in an extending direction of the short side of the aperture so that the long sides thereof face to each other. A distance between the facing long sides of the inter-element via holes 88 and 88 is 10 μm.

The reason for forming the polyimide pattern 93 will be described hereinbelow. The presence of the polyimide pattern 93 makes it possible to lay a positive resist for the resist pattern 94 on the polyimide pattern 93. Accordingly, the resist pattern 94 may be thicker in the area for forming the inter-element via hole group 89 and thinner in other areas. This decreases stress inside the resist pattern 94, thereby constraining deformation of the resist pattern 94 during and after formation of the resist pattern 94. In addition, longer dry etching time is obtainable.

Thus, there are achieved the inter-element via holes 88, 88 having a via hole aperture that is small in size shift from the resist pattern 94 and large in depth.

Figure 26:
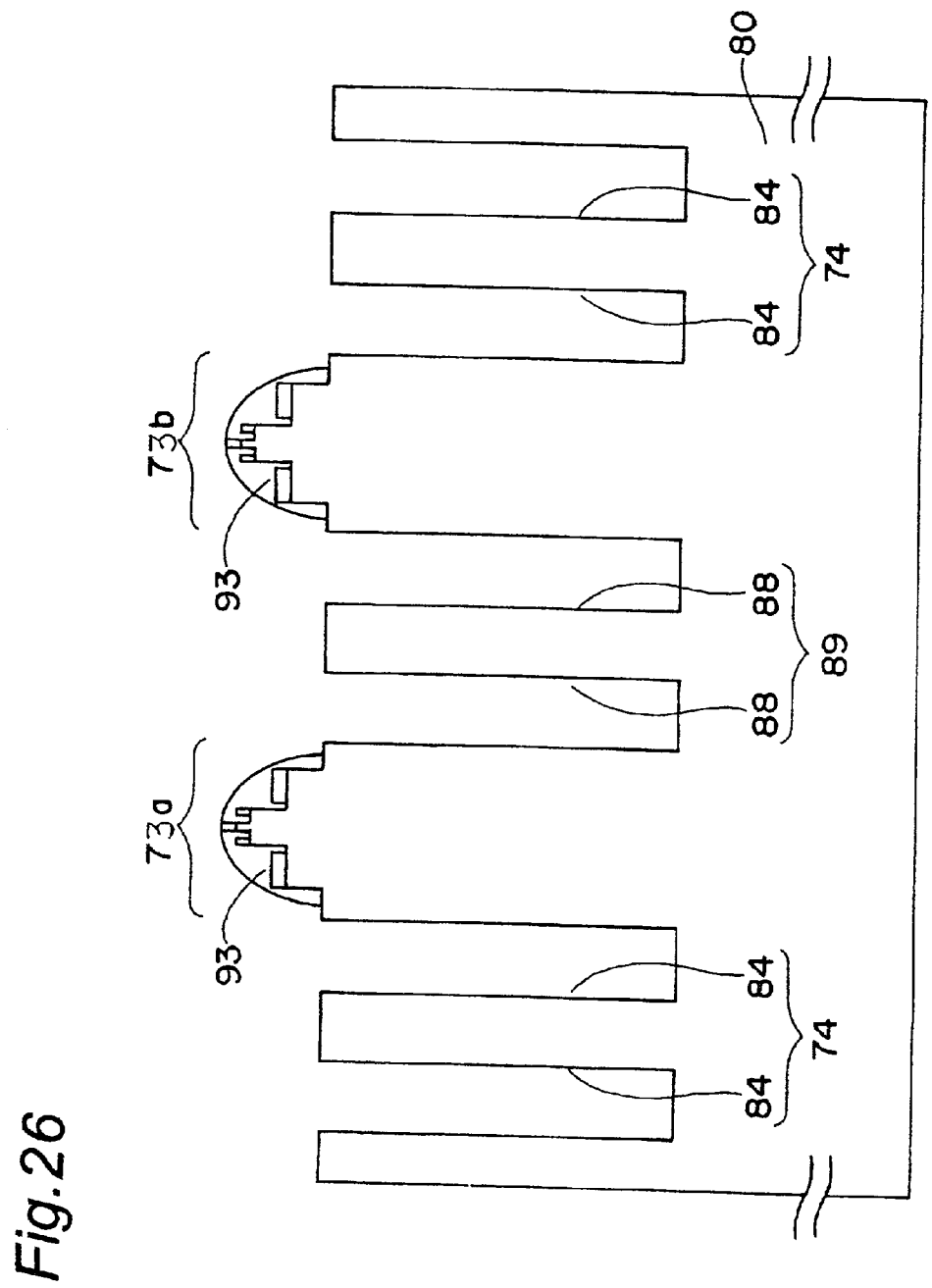
FIG. 26 is a cross sectional view showing one step of manufacturing the semiconductor element included in the fifth embodiment.

Next, with use of the resist pattern 94 in the area for forming the via hole group 74 and the inter-element via hole group 89 as a mask, dry etching is conducted by an ICP etching unit to form via a hole 84 and an inter-element via hole 88 as shown in FIG. 26.

Here, the ICP etching unit is provided with the etching conditions of $Cl_2$(40 sccm)+$SiCl_4$(40 sccm) used as mixed gas, pressure of 30 Torr in an etching chamber, substrate temperature of 20° C., and etching time of 30 minutes.

Here, the average short side×long side aperture size of the via hole 84 on the overall surface is 11 μm×60 μm, and the depth thereof is approx. 90 μm. The average short side×long side aperture size of the inter-element via hole on the overall surface is 11 μm×20 μm, and the depth thereof is approx. 80 μm.

In the above etching process, a mask for dry etching is of two-layer structure composed of the polyimide pattern 93 and the resist pattern 94, which enables the via hole 84 and the inter-element via hole 88 to decrease a quantity of an aperture size shift from the aperture size of the mask to approx. 1 μm only in the short side direction.

It is particularly important for the inter-element via hole 88 to have a small quantity of a shift from the mask size since the inter-element via hole 88 is adjacent to the single HBT elements 73a and 73b. Also, post exposure baking (PEB) of the resist pattern 94 at approx. 110° C. enables achievement of high selectivity to GaAs, a material of the substrate 80, and enables dry etching for 30 minutes. This implements increase of the depth of the inter-element via hole 88 to 80 μm. Since the depth of the inter-element via hole 88 determines the thickness of the substrate 80 after etching, deep etching of the via hole is desirable in consideration of the strength of the substrate 80.

After the dry etching is conducted, the resist pattern 94 is removed by a removing agent and the like. Here, since the polyimide pattern 93 is removed only by a dedicated removing agent, the polyimide pattern 93 is remained in the state of covering the single HBT elements 73a and 73b as shown in FIG. 26.

Figure 27:
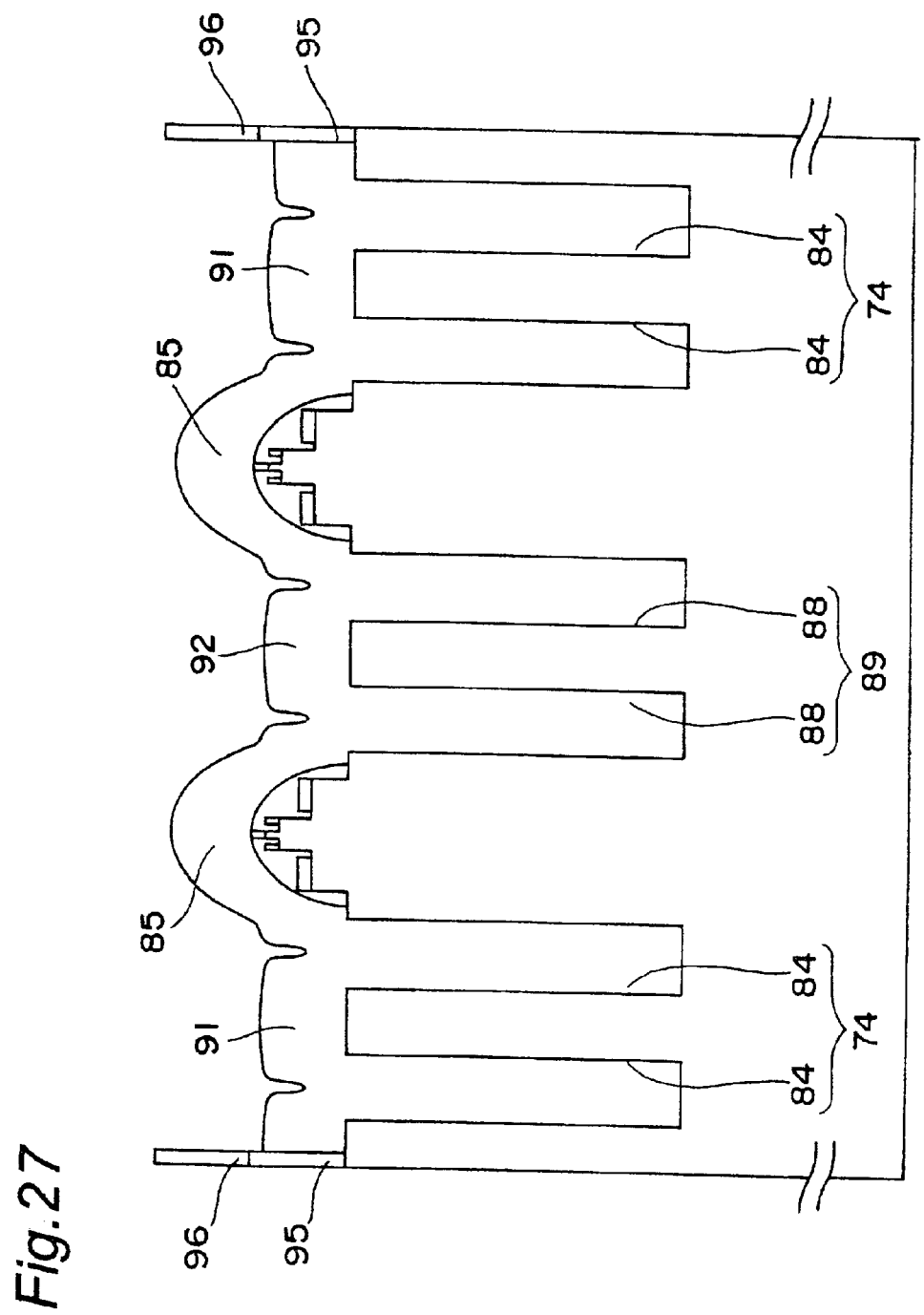
FIG. 27 is a cross sectional view showing one step of manufacturing the semiconductor element included in the fifth embodiment.
Figure 28:
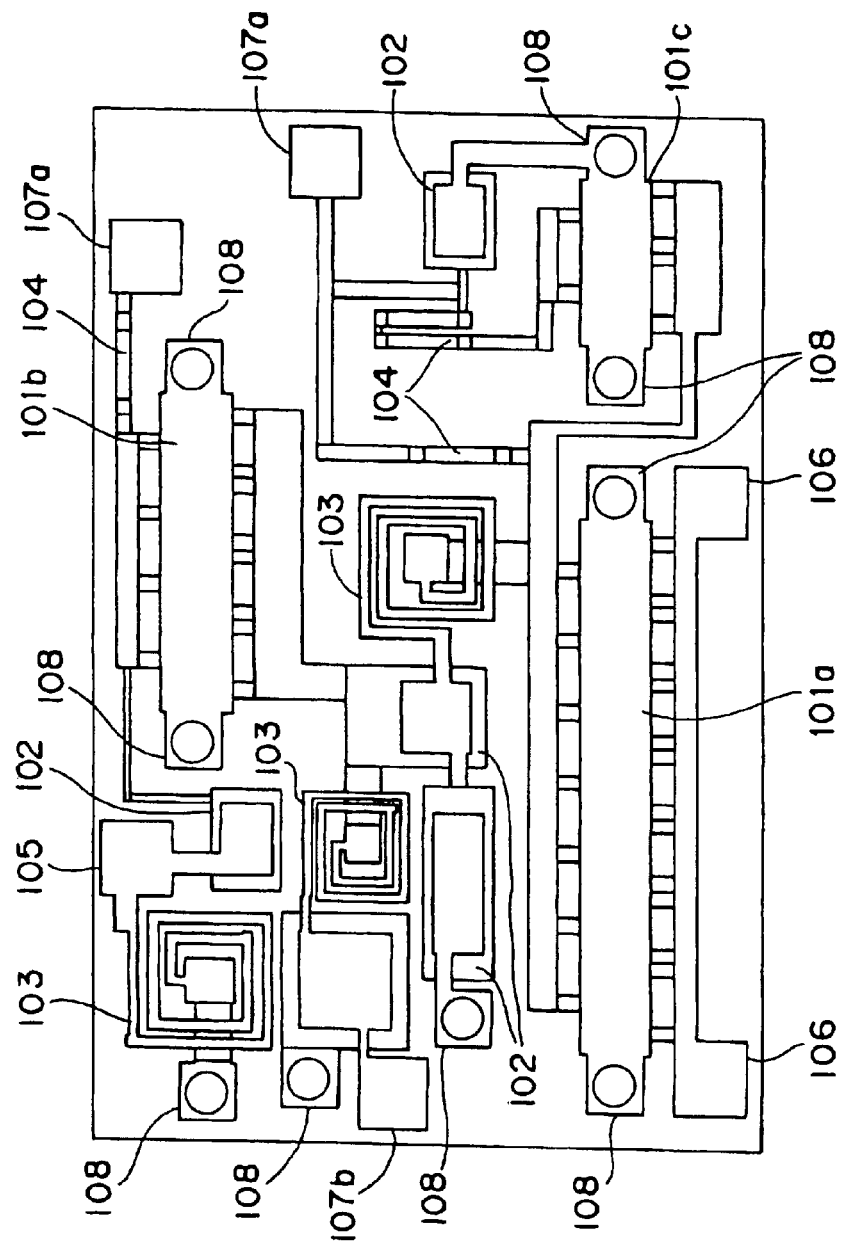
FIG. 28 is a plane view showing the structure of a conventional amplifier MMIC for microwave band application.
Figure 29:
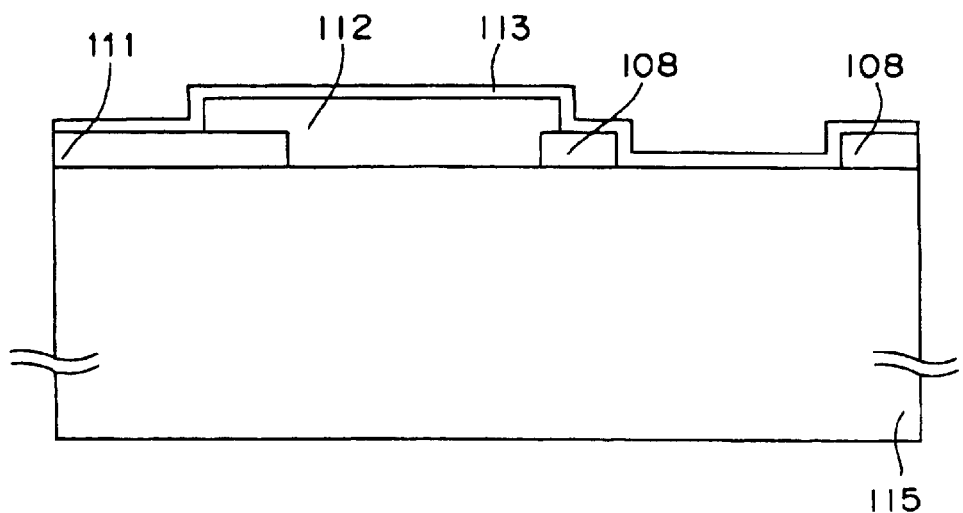
FIG. 29 is a cross sectional view showing one step of manufacturing a ground electrode included in the conventional example.
Figure 30:
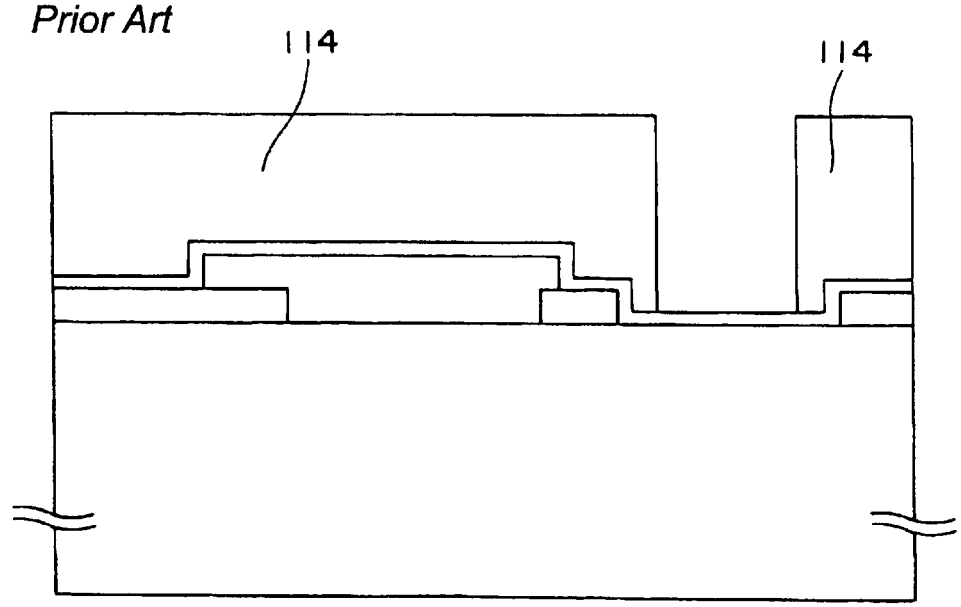
FIG. 30 is a cross sectional view showing one step of manufacturing a ground electrode included in the conventional example.
Figure 31:
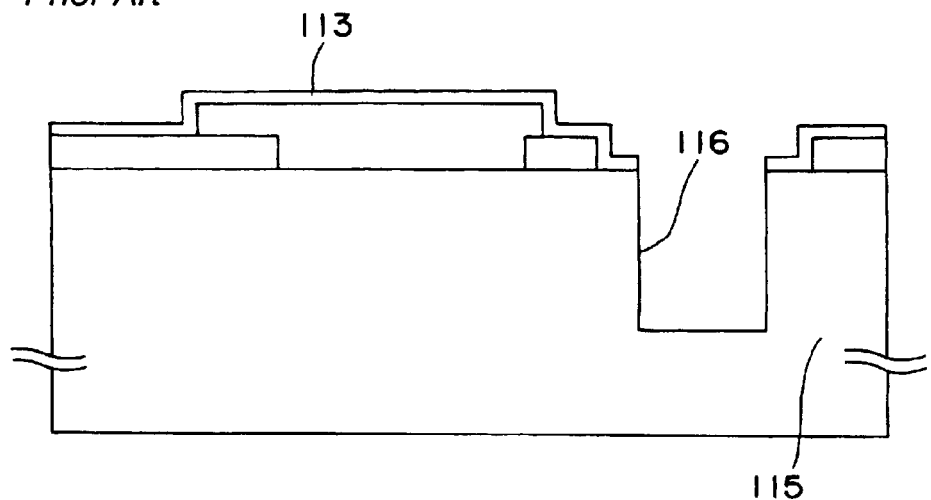
FIG. 31 is a cross sectional view showing one step of manufacturing a ground electrode included in the conventional example.
Figure 32:
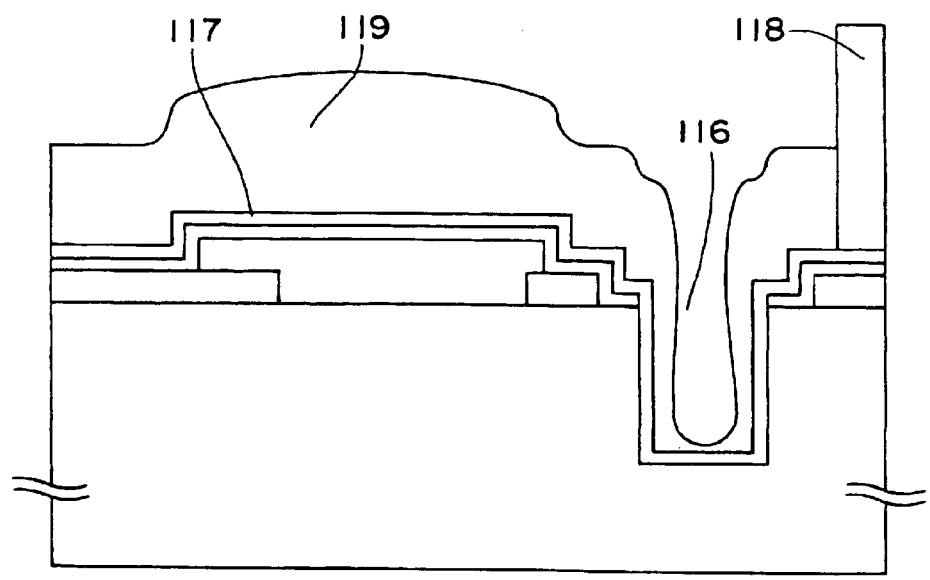
FIG. 32 is a cross sectional view showing one step of manufacturing a ground electrode included in the conventional example.
Figure 33:
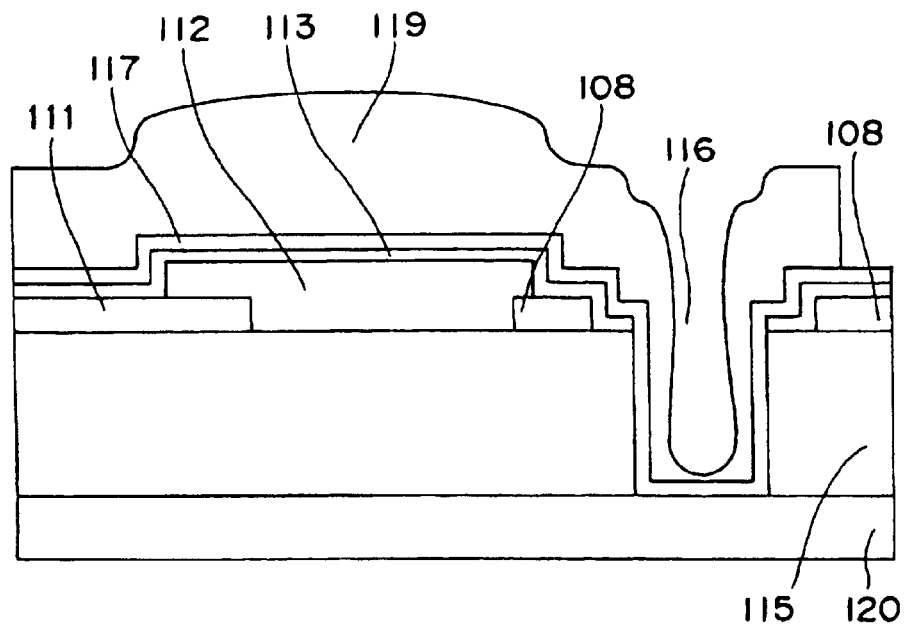
FIG. 33 is a cross sectional view showing one step of manufacturing a ground electrode included in the conventional example.

Next, as shown in FIG. 27, a resist pattern 95 for plating protection is formed with a negative resist in order to prevent plating of unnecessary part in plating operation. Then, a Ti/Au metal feed layer for plating feed (unshown) is formed on the entire surface by vacuum deposition method with use of a rotating substrate holder, and again a resist pattern 96 is formed with a negative resist for forming an emitter interconnection 85, a ground electrode 91, and an inter-element ground electrode 92 on the resist pattern 95. Use of the vacuum deposition method for forming the Ti/Au metal feed layer for plating feed brings about an effect of reducing a damage inflicted on the resist pattern 95 for plating protection compared to the sputtering method.

Next, with use of the resist pattern 96 as a mask, electrolytic plating is conducted to form the emitter interconnection 85, the ground electrode 91, and the inter-element ground electrode 92, which integrates the emitter electrode 81 and the emitter interconnection 85. Also, each via hole 84 is connected via the ground electrode 91, and each inter-element via hole 88 is connected via the inter-element ground electrode 92 to form integration.

In operation of electrolytic plating, plating is continued till an aperture portion of each via hole 84 and inter-element via hole 88 is completely blocked. In the fifth embodiment, the aperture portion of each via hole 84 and inter-element via hole 88 is completely blocked when the ground electrodes 91 and 92 are provided with a plating thickness of approx. 12 μm.

If the aperture portion of each via hole 84 and inter-element via hole 88 is not completely blocked, a back surface electrode 90 is not formed on the bottom of each via hole 84 and inter-element via hole 88 in some cases. In such cases, problems are generated such as characteristic failure of high ground inductance and mounting failure due to leakage of a die bond material through each via hole 84 and 88.

For reducing unevenness on the surface of the substrate 80 by blocking the aperture portion of each via hole 84 and inter-element via hole 88, it is effective to make the aperture size of the via holes 84 and 88 to be 20 μm or less.

Next, the resist pattern 96 and the resist pattern 95 shown in FIG. 27 are removed.

Next as shown in FIG. 23, with the substrate 80 being attached to a support substrate (unshown), the back surface of the substrate 80 is etched away till a plated metal 92a inside the inter-element via hole 88 is exposed. Further, a backside electrode 90 is formed on the entire back surface to complete the MMIC of the present embodiment. Here, the thickness of the substrate 80 is approx. 80 μm.

Furthermore, the MMIC is mounted on a ceramic substrate. A silver paste is used as a die bond material. In the fifth embodiment, since the aperture portions of the via holes 84 and 88 are completely blocked by the plated metals 91a and 92a, there is generated no mounting failure such as leakage of the silver paste from the via holes 84 and 88 to the surface of the MMIC.

An inductance of the ground electrode 91 including the via hole group 74 and an inductance of the inter-element ground electrode 92 including the inter-element via hole group 89 of the fifth embodiment were measured from a test element group formed together with the MMIC. The result indicated that the ground inductance of the ground electrode 91 including the via hole group 74 was 12 pH, while the ground inductance of the inter-element ground electrode 92 including the inter-element via hole group 89 was 35 pH.

The ground inductance of the HBT element 73 composed of the single HBT elements 73a and 73b was approx. 8 pH with a space between the centers of the single HBT elements 73a and 73b being 55 μm. Accordingly, the MMIC of the fifth embodiment may obtain a gain as high as approx. 15 dB in a small signal of 60 GHz.

In the case where the inter-element via hole group 89 was composed of three inter-element via holes 88, the ground inductance of the HBT element was 9 pH with a space between the centers of the single HBT elements being 75 μm. In the case where the inter-element via hole group 89 was composed of four inter-element via holes 88, the ground inductance of the HBT element was 8 PH with a space between the centers of the single HBT elements being 95 μm.

Like the fifth embodiment, forming the ground electrodes 91 and 92 between a plurality of three-terminal active elements so as to provide a plurality of via holes 84 and 88 brings about an effect of minimizing increase of the ground inductance despite the widened space between the centers of the single HBT elements 73a and 73b. In addition, widening the space between the centers of the single HBT elements 73a and 73b as heating elements leads to reduction of heat resistance, which implements an effect of improving reliability of the HBT element 73 as well as the MMIC.

For example, the HBT element for use in an amplifier for microwave band applications satisfies a desired characteristic when operating in current density of around 20 kA/cm$^2$, whereas the HBT element for use in an amplifier for millimeterwave band applications can satisfy a desired characteristic only when operating in high current density of around 100 kA/cm$^2$. Thus, the HBT element for millimeterwave band applications operates in current density 5 times as high as the current density of the HBT element for microwave band applications, which has conventionally generated failure due to increase of a junction temperate inside each HBT element for the millimeterwave band applications.

Accordingly, for decreasing the junction temperature, it is necessary for reducing interaction of heat generated by each HBT element by widening a space between the centers of the HBT elements.

As a prior art example, Japanese Patent Laid-Open Publication No. HEI 8-279562 discloses that a via hole is provided between a plurality of HBT elements to reduce an inductance as well as to reduce heat resistance.

However, for application in extremely high frequency like the MMIC for millimeterwave band applications, forming a single via hole between the HBT elements does not achieve sufficient reduction of an inductance. In terms of reduction of heat resistance, high heat resistance of a die bond material interposed between the MMIC and a package material disturbs heat discharge from the back surface electrode, thereby making the prior art invention improper for practical millimeterwave band applications.

Accordingly, for decreasing the junction temperature without depending on heat discharge from the back surface electrode, it is necessary to widen a space between the centers of the HBT elements as heating elements, as well as to reduce the inductance increased by widening the space between the centers of the HBT elements.

According to the fifth embodiment, it is possible to reduce increase of the inductance to the minimum by disposing appropriate via hole groups even if the distance between the centers of the HBT elements becomes large enough for enabling practical application.

Like the HBT element for millimeterwave band applications, it is essential for the elements requiring operation in high current density for obtaining a good high-frequency characteristic to fulfill low ground inductance and low heat resistance, which confers an advantage on the structure of the present invention.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconauctor device comprising:

a semiconductor element formed on one side of a semiconductor substrate, the semiconductor element having a ground electrode and at least one via hole group formed in the semiconductor substrate, the ground electrode of the semiconductor element being connected to an electrode provided on the other side of the semiconductor substrate by means of the via hole group, wherein the via hole group includes a plurality of via holes disposed directly adjacent to each other so that an electromagnetic field generated in each of the plurality of adjacent via holes in the group is bonded to each other wherein a distance between the plurality of via holes at a closest adjacent point is in the range of 5 μm to 50 μm.

2. The semiconductor device as defined in claim 1, wherein a distance between the plurality of via holes at a closest adjacent point is in the range of 5 μm to 50 μm.

3. The semiconductor device as defined in claim 2, wherein the plurality of via holes each have an aperture shape of a rectangle on the semiconductor substrate.

4. The semiconductor device as defined in claim 3, wherein each of the plurality of via holes in the semiconductor substrate has an aperture short side of the rectangle shape with a size of 5 μm to 20 μm.

5. The semiconductor device as defined in claim 3, wherein the plurality of via holes are disposed so as to be aligned in a direction orthogonal to an aperture long side of the rectangle shape of each via hole, and the aperture long side of each via hole is approximately parallel to each other.

6. The semiconductor device as defined in claim 5, wherein one via hole group is constituted per two or three via holes.

7. A monolithic microwave integrated circuit of an amplifier for microwave band application comprising the semiconductor device as defined in claim 1.

8. A monolitnic microwave integrated circuit for millimeterwave band application including a microstrip line comprising a semiconductor device as defined in claim 1, wherein the semiconductor device constitutes a point electrode for a short-circuit stub.

9. A monolithic microwave integrated circuit for millimeterwave band application including a microstrip line comprising a semiconductor device as defined in claim 1, wherein the semiconductor device constitutes a ground electrode for a three-terminal active element.

10. A monolithic microwave integrated circuit for millimeterwave band application including a microstrip line comprising a semiconductor device as defined in claim 1, wherein the semiconductor device constitutes a ground electrode disposed between a plurality of three-terminal active elements.

* * * * *